United States Patent
Saint-Marcel et al.

(10) Patent No.: US 10,482,211 B1
(45) Date of Patent: Nov. 19, 2019

(54) SYSTEM AND METHOD FOR ELECTRONIC CIRCUIT DESIGN EDITING HAVING ADAPTIVE VISUAL INDICIA FOR RELATIVE CURRENT LOADING OF CIRCUIT LAYOUT PORTIONS

(71) Applicant: CADENCE DESIGN SYSTEMS, INC., San Jose, CA (US)

(72) Inventors: Laurent Rene Saint-Marcel, Mouans-Sartoux (FR); Laurent Robert Chouraki, Mougins (FR); Alexandre Roger Maurice Soyer, Grasse (FR)

(73) Assignee: CADENCE DESIGN SYSTEMS, INC., San Jose, CA (US)

(*) Notice: Subject to any disclaimer, the term of this patent is extended or adjusted under 35 U.S.C. 154(b) by 105 days.

(21) Appl. No.: 15/886,119

(22) Filed: Feb. 1, 2018

(51) Int. Cl.
 *G06F 17/50* (2006.01)
 *G06F 3/0484* (2013.01)

(52) U.S. Cl.
 CPC ...... *G06F 17/5072* (2013.01); *G06F 3/04847* (2013.01); *G06F 17/5077* (2013.01)

(58) Field of Classification Search
 CPC ............ G06F 17/5072; G06F 3/04847; G06F 17/5077
 USPC ........................................................ 716/120
 See application file for complete search history.

(56) References Cited

U.S. PATENT DOCUMENTS

| | | | | |
|---|---|---|---|---|
| 2005/0138588 A1* | 6/2005 | Frenkil | ............... | G06F 17/5031 716/113 |
| 2006/0224337 A1* | 10/2006 | Hazucha | .................. | G06F 1/28 702/64 |
| 2007/0024254 A1* | 2/2007 | Radecker | .............. | H02M 7/537 323/247 |
| 2007/0069736 A1* | 3/2007 | Shrivastav | .......... | G06F 17/5036 324/500 |
| 2012/0176164 A1* | 7/2012 | Arndt | ...................... | H01L 23/62 327/109 |

* cited by examiner

*Primary Examiner* — Suchin Parihar
(74) *Attorney, Agent, or Firm* — Tarolli, Sundheim, Covell & Tummino LLP

(57) ABSTRACT

In an electronic circuit design system, a physical layout of at least part of an electronic circuit design is visually rendered. Magnitude of current loading are determined at one or more of the circuit nodes, or one or more clusters of nodes grouped according to predetermined clustering criteria, for a selected net or nets. The range of magnitudes is mapped to at least one gradation range for visual indicia of preselected type, such as a predetermined color spectrum; preferably, alternative gradation ranges respectively for current sources and current sinks are provided. The visual indicia of the current loading magnitudes are then adaptively displayed to overlay the corresponding circuit nodes or clusters in the rendered physical layout, providing a reference for a designer to proportionately size segments of the selected net or nets, as well as spacing required for the segments.

20 Claims, 14 Drawing Sheets
(7 of 14 Drawing Sheet(s) Filed in Color)

FIG. 1B
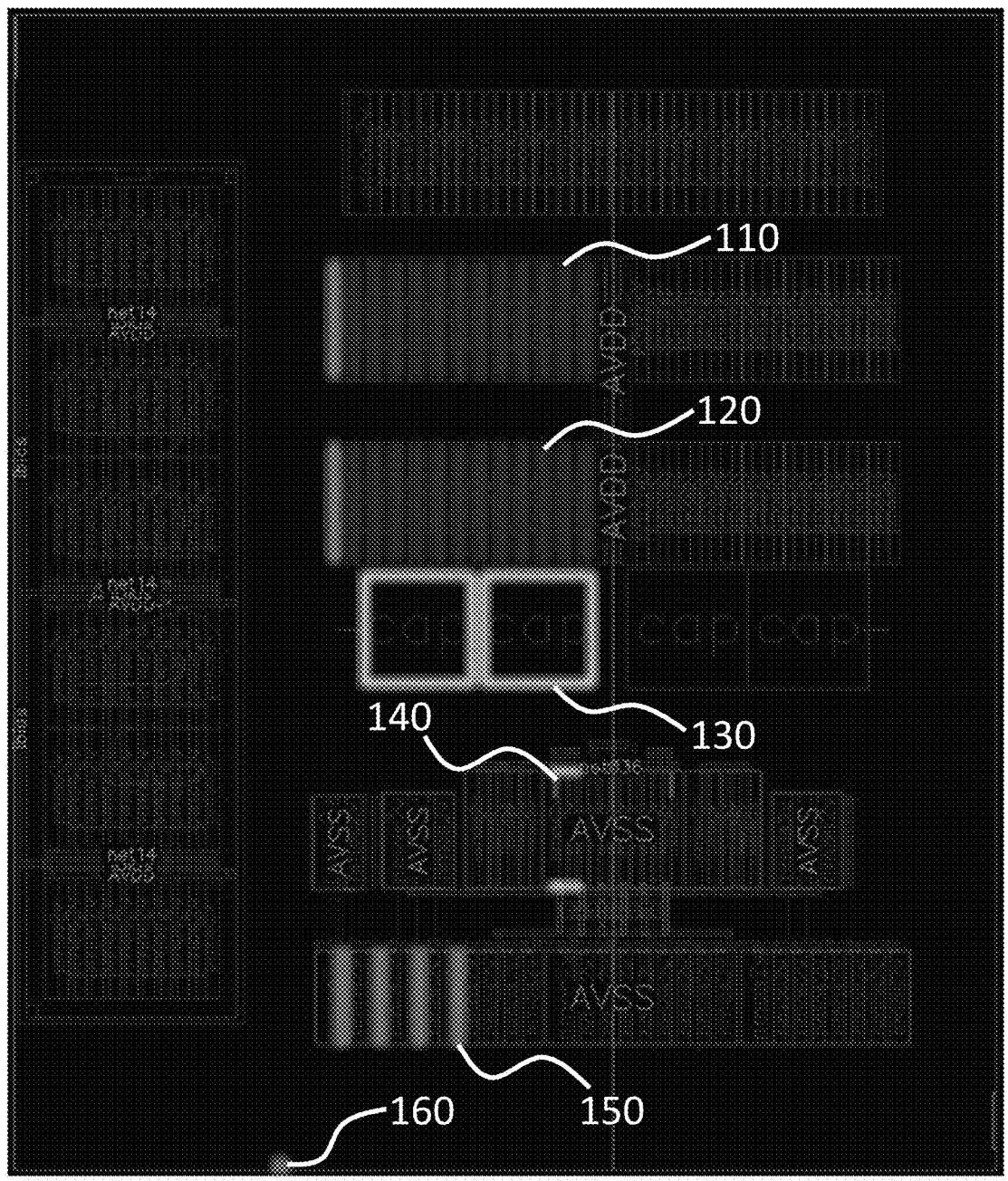
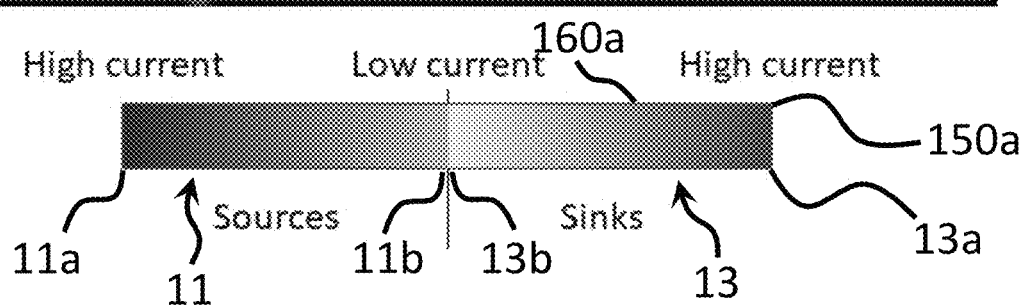

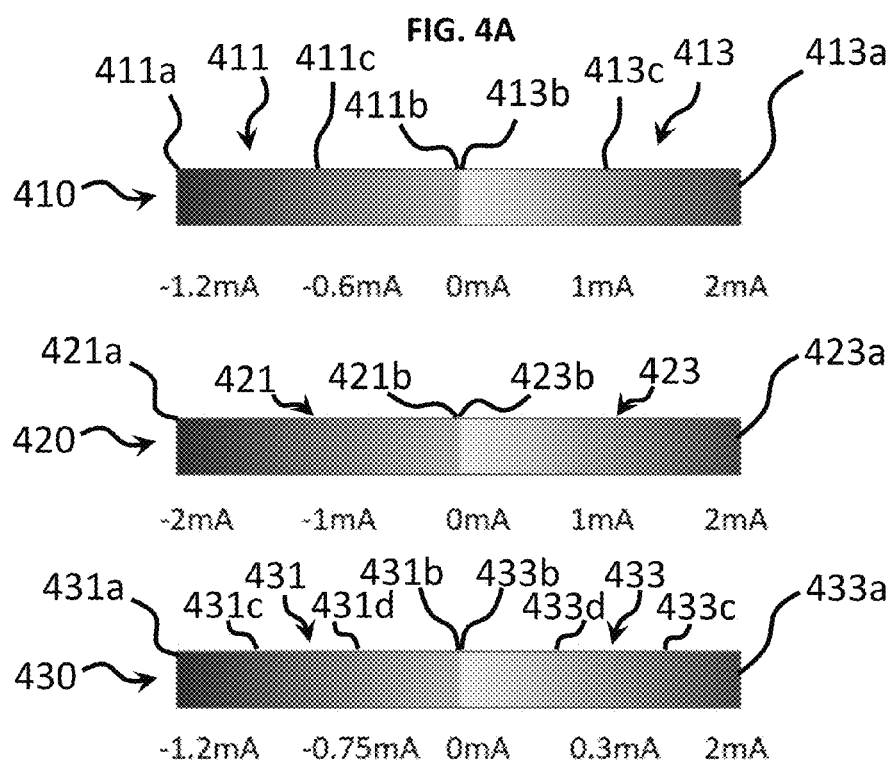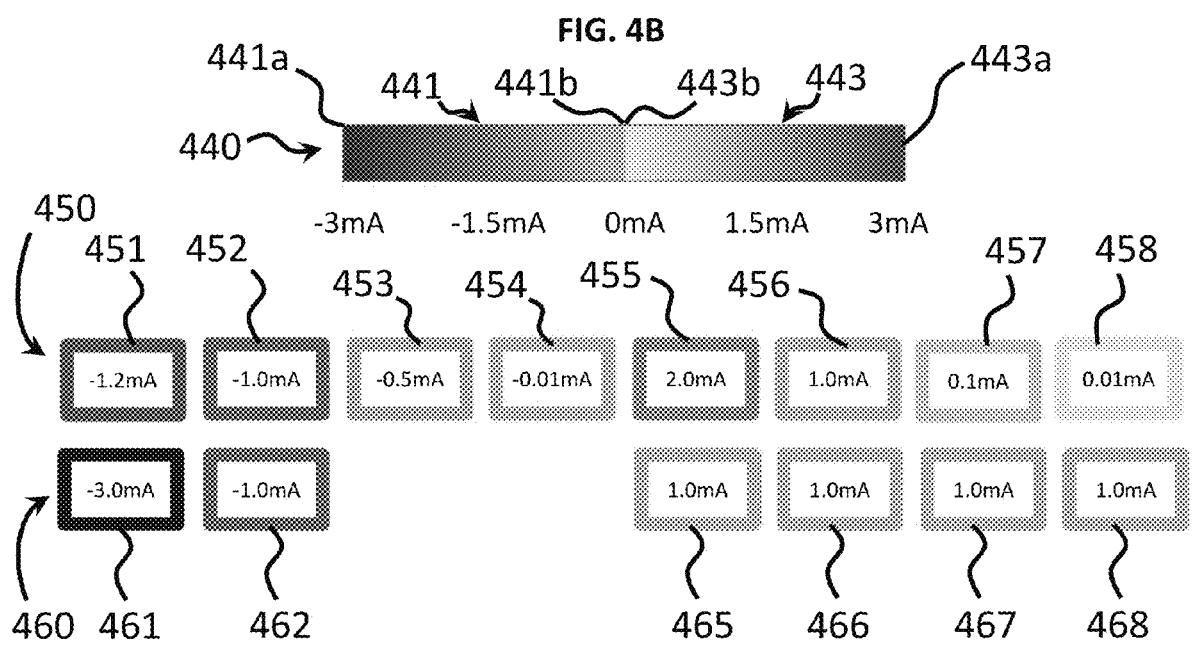

SYSTEM AND METHOD FOR ELECTRONIC CIRCUIT DESIGN EDITING HAVING ADAPTIVE VISUAL INDICIA FOR RELATIVE CURRENT LOADING OF CIRCUIT LAYOUT PORTIONS

BACKGROUND OF THE INVENTION

The subject system and method are generally directed to viewing and editing a circuit design on a circuit design editor. The system and method generally provide for intuitive, visual indication of current loading magnitudes at various portions of the circuit layout. Among other things, this adaptively aids a designer to preemptively determine the suitable relative sizing of certain segments of nets at those circuit portions for conductively interconnecting circuit components based on their expected current loading.

Conventional electronic circuit designs in many applications tend to be both highly complex and highly precise. Robust circuit design editors have therefore become increasingly important to the design process. Such editors allow a circuit designer or design team to arrange, configure, and adjust various electronic components and the interconnections therebetween, for ultimate manufacture of the resulting circuit design. Various editors also enable simulation of a circuit's behavior, to test the circuit for flaws in power, timing, or other operational features or properties, which assists the circuit designer in making any necessary adjustments. Additional benefits in various editors include automated measures for monitoring the design to confirm that its elements suitably comply with predetermined criteria. The circuit product can thereby be improved and brought into compliance with the applicable criteria before time and expense are spent on manufacturing a physical circuit in accordance with the designed layout.

Because of the complexity of the circuits being designed, a circuit design layout may be crowded with information as displayed by a circuit design editor, yet lack the intuitive presentation of information to optimize the design process. It is therefore an ongoing effort in the field to develop a more intuitive presentation of pertinent information, in a manner that makes efficient and productive use of the circuit editor's visual display capabilities.

SUMMARY OF THE INVENTION

It is an object of the present invention to adaptively present information relating to a magnitude of current loading for portions of a circuit layout in clear and intuitive manner to a user.

It is another object of the present invention to display visual indication of current loading magnitude on a physical circuit layout to provide a reference for proportionately sizing one or more segments of a net within the physical circuit layout.

It is yet another object of the present invention to group portions of a circuit layout to display visual current loading information collectively for a cluster of such circuit layout portions.

It is still another object of the present invention to display visual current loading information with a physical circuit layout for preemptively determining proportionate sizes of net segments to be disposed therein.

These and other objects may be attained in a system for interactively editing an electronic circuit design defined by a plurality of electronic components interconnected at respective circuit nodes by a plurality of nets, having preemptive indication of current loading for one or more of the nets. The system includes a display which visually renders at least a part of the electronic circuit design to graphically represent a physical layout thereof. A graphic layout controller executed on a processor is coupled to the display. The graphic layout controller includes an electrical awareness portion determining a magnitude of current loading at one or more of the circuit nodes interconnected by a selected one of the nets, and an indicia scaling portion defining a gradation range for visual indicia of preselected type and mapping a range of magnitudes for the current loading of the one or more circuit nodes of the selected net thereto. The graphic layout controller also includes a graphic rendering portion adaptively displaying with the displayed part of the electronic circuit design the visual indicia for at least one circuit node of the selected net, where the visual indicia for the circuit node is graduated within the gradation range responsive to the magnitude of current loading determined therefor. The adaptively displayed visual indicia serve to provide a reference for proportionately sizing one or more segments of the selected net within the physical layout. A user interface is coupled to the display and graphic layout controller.

A system formed in accordance with certain embodiments of the present invention provides for interactively editing an electronic circuit design defined by a plurality of electronic components interconnected at respective circuit nodes by a plurality of nets, with preemptive indication of relative current loading for one or more of the nets. The system includes a display visually rendering at least a part of the electronic circuit design to graphically represent a physical layout thereof. A graphic layout controller executed on a processor is coupled to the display, and includes an electrical awareness portion which operates to determine a magnitude of current loading at each of the circuit nodes interconnected by a selected one of the nets. The graphic layout controller also includes an indicia scaling portion defining a gradation range for visual indicia of preselected type and mapping a range of magnitudes for the current loading of one or more circuit nodes of the selected net thereto. The indicia scaling portion defines alternative gradation ranges for circuit nodes depending on operation thereof as a current source or as a current sink. The graphic layout controller further includes a graphic rendering portion adaptively displaying the visual indicia for at least one circuit node of the selected net superimposed on the displayed part of the electronic circuit design. The visual indicia for each circuit node is graduated within the gradation range responsive to the magnitude of current loading determined for that circuit node, and the adaptively displayed visual indicia provides a reference for proportionately sizing a segment of the selected net terminating at the circuit node relative to another segment of the selected net within the physical layout. A user interface is coupled to the display and graphic layout controller.

A method implemented in accordance with certain embodiments of the present invention provides for interactively editing an electronic circuit design defined by a plurality of electronic components interconnected at respective circuit nodes by a plurality of nets, with preemptive indication of current loading for one or more of the nets. The method includes visually rendering on a display at least a part of the electronic circuit design to graphically represent a physical layout thereof. A computer processor is actuated to execute a graphic layout controller implemented thereon, and execution of the graphic layout controller includes determining a magnitude of current loading at one or more of the circuit nodes interconnected by a selected one of the nets. Execution of the graphic layout controller also includes defining a gradation range for visual indicia of preselected type and mapping a range of magnitudes for the current loading of the one or more circuit nodes of the selected net thereto; and, adaptively rendering the visual indicia for at least one circuit node of the selected net concurrently with the displayed part of the electronic circuit design. Execution of the graphic layout controller further includes graduating the visual indicia for the circuit node within the gradation range responsive to the magnitude of current loading determined therefor. The method as implemented also establishes a user interface to the display and graphic layout controller, and actuates the user interface to proportionately adjust at least one segment of the selected net in size relative to another segment of the selected net within the physical layout, doing so based on the adaptively rendered visual indicia.

Additional aspects, details, and advantages of the disclosed system and method will be set forth, in part, in the description and figures which follow.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1B is a depiction of the rendered circuit layout of FIG. 1A, with visual indicia applied to components thereof, in accordance with an exemplary embodiment of the invention;

FIGS. 4A and 4B are depictions of illustrative examples of gradation ranges generated by the mapping method of FIG. 2C, in accordance with an exemplary embodiment of the invention;

DETAILED DESCRIPTION OF THE PREFERRED EMBODIMENTS

Figure 1A:
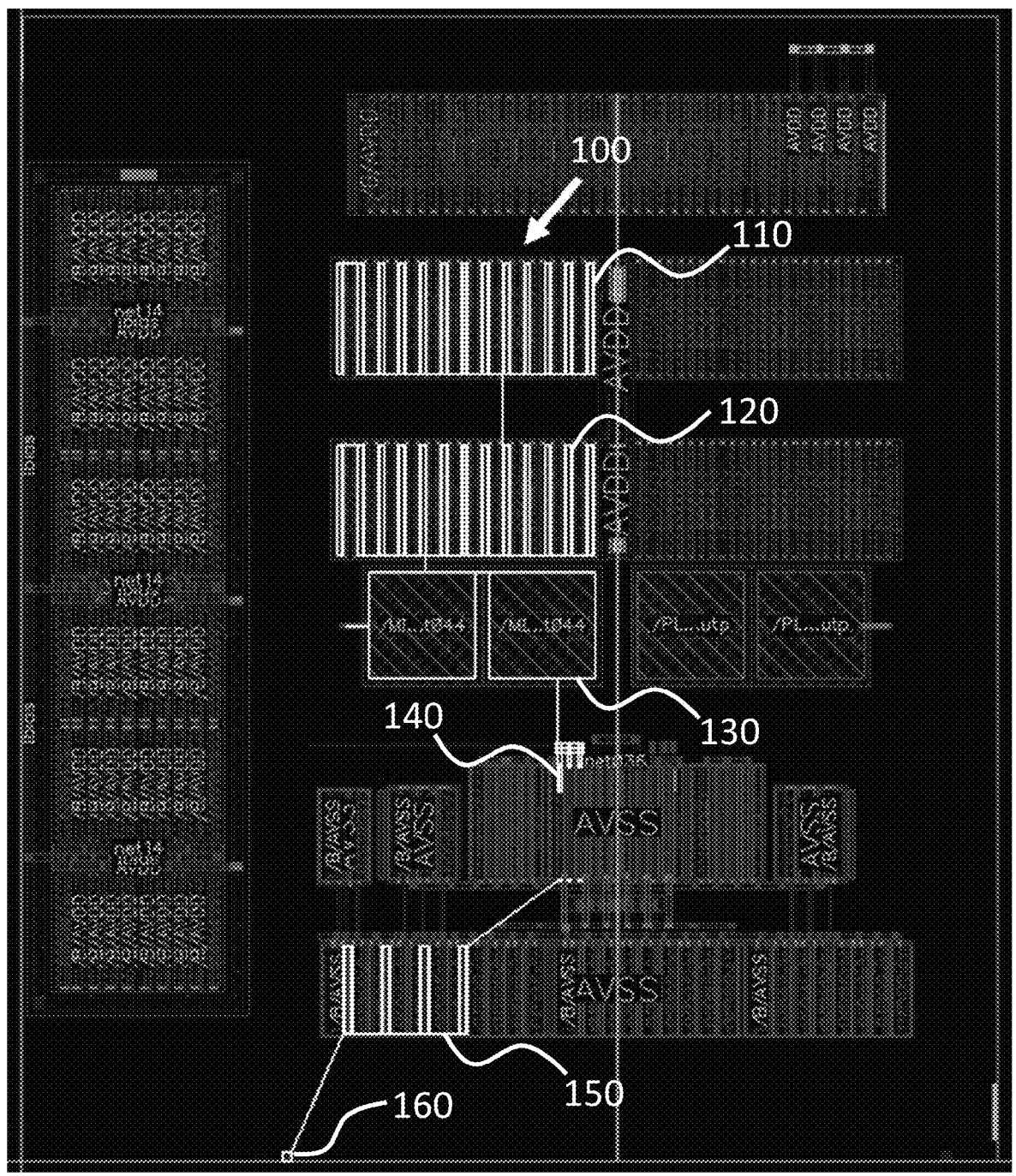
FIG. 1A is a depiction of an illustrative example of a rendered circuit layout representing a portion of a circuit.

Reference will now be made in detail to exemplary embodiments, which are illustrated in the accompanying drawings, wherein like reference numerals refer to the like elements throughout. The embodiments are described below in order to explain the disclosed system and method by referring to the figures.

In designing a physical layout for an electronic circuit chip, the designer must take account of the currents passed through the various wires or other conductive interconnections of that chip, as the wires must be sized in physical dimension to accommodate the maximum magnitude of current to be passed therethrough. If a wire as implemented were too small, real world factors (typically not present under theoretical or ideal conditions) such as electronic resistance of the conductive material, may cause degradation in the wire's performance, leading perhaps to ultimate breakdown/failure. Conversely, if a wire as implemented were too large, the resulting chip would be needlessly large, leading to waste and higher manufacturing costs. Consequently, optimal sizing of the wires is a notable factor in optimizing the cost of chip manufacture.

As current and emerging technologies increasingly employ high-frequency circuit designs with extremely fast response, circuits and their interconnection wires must be implemented smaller and smaller in dimension. Factors such as electro-migration within a conductive wire, which may lead to physical deterioration of the conductor material due to atomic-level forces, become less trivial. In high speed, high current applications like LIDAR or RADAR chips, for example, the stakes of effective management of current through suitably sized wires are typically quite high. It is imperative that designers of electronic circuit chips in such applications remain mindful of the current loading on the wires to be encountered during circuit operation, and that effective measures be taken to preemptively adapt the circuit design to, for instance, preserve ample real estate in the circuit's layout for the routing of wires with segments proportionately sized to suit their current loading.

The required sizing of wires is typically predefined in many applications. Based on experiments, for instance, rules may be extracted for implementation of the chip. Various tools and technologies are also available for use by a given design tool by which to determine appropriate sizing of a circuit design's wires. But there remains a need for a circuit editing system to simply yet effectively present to the designer relevant information, like the current magnitude applicable to various circuit nodes.

Briefly, a system and method realized in accordance with certain aspects of the present invention provide for interactively editing an electronic circuit design, with preemptive indication of relative current loading for one or more of the nets in the circuit design. At least a part of the electronic circuit design is displayed for the designer, with a graphic representation of the circuit's physical layout. A processor-based graphic layout controller is executed to incorporate into the display visual alert (indicia) of current loading magnitude at one or more of the circuit nodes interconnected by a certain set of wires (or segments of a net). The graphic layout controller establishes a visual scale for the visual indicia, in the form of a gradation range of color or other type which maps to a range of magnitudes for the current loading at the circuit nodes. Preferably, the visual indicia is presented with alternative gradation ranges for a circuit node depending on whether that node is serving as a current source or as a current sink. The visual indicia for a circuit node is preferably superimposed on the corresponding portion of the electronic circuit design displayed.

The visual indicia for each circuit node is graduated according to the magnitude of current loading determined for that circuit node. This provides a quick and intuitively apparent indication of the current loading magnitude at the different circuit nodes that segments of an interconnection extend to. This adaptively graduated visual indication of the applicable current loading magnitudes provides a quickly ascertained reference for the proportionate sizing needed for the interconnection segment terminating at each circuit node in question (or at a clustered grouping of them), relative to another segment of that same interconnection within a given physical layout. Suitable preemptive measures may then be taken to ensure that the appropriate amount of circuit layout real estate may be preserved for subsequent routing of such suitably sized interconnection segment therein.

The visual indication of the magnitude of current loading may in certain cases be displayed for a cluster of circuit nodes grouped together because of a certain relationship between them (pins of the same device, relative proximities of the circuit nodes, relative directional orientations of the circuit nodes, type of electronic component associated with the circuit nodes, etc.). The visual indication may highlight whether the node or cluster of nodes is serving as a current source or current sink.

As noted, there are many applications known in the art where it is desirable for various reasons (including performance and manufacturing considerations) to design a circuit as small as possible. However, certain factors relating to size/dimensional capacity are difficult to determine in advance, prompting a circuit layout designer to estimate various space-related margins of error in the layout for at least the early layout design stages, when the positions of circuit components are generally determined. As circuit layout details are developed and more fully established in later design stages, whether these margins were necessary can eventually be determined. A cautious designer typically takes an "overspacing" approach to preserve ample space to accommodate actual sizes for portions of a physical circuit layout. It is typically impractical to alter the positioning of the circuit components at the latter stages, potentially resulting in less than optimal utilization of circuit layout real estate (such as unnecessarily large empty spaces, unduly bunched net segments, or the like in the final design). However, the alternative approach of "underspacing" at the early design stages poses the risk of consuming circuit layout real estate that may be needed to accommodate changes occurring in later stages of design. This could require early stages to be re-done, which unduly lengthens the design process.

Interconnections, as a point of design practice, are typically not routed in the early stages of layout design. Rather, they are routed after placement of the components they interconnect is determined with some degree of certainty. It is therefore necessary to leave sufficient space between the components in the circuit layout for these interconnections, until such time as the interconnections are actually routed. To reduce the potential consequences of both overspacing and underspacing, it is desirable to take suitable preemptive measures to preserve optimal, appropriate spacing at given portions of the circuit layout to accommodate, for instance, segments of the interconnection nets which are proportionately sized to suit the magnitude of current loading thereon during expected circuit operation.

A notable factor in determining the requisite space for a segment of interconnection is the electrical current expected to flow through the interconnection during circuit operation. The minimum width of wire (a conductive segment of an interconnection net) necessary to carry the current, without undue risk of damage or altered performance, increases proportionally with the rate of current when all other factors are maintained. If a designer can determine such current loading capacity needed for a given wire between circuit nodes, the designer could more accurately predict how much space to preserve in the circuit layout for that wire. An effective system or method for providing this information in an intuitive fashion would simplify the work of the designer, in turn reducing both overspacing and underspacing in a design, and therefore the costs of both designing and manufacturing the resulting circuit.

Some such systems and methods are described herein. Specifically, according to various embodiments of the invention, the current loading for one or more nodes of given components are visually presented by highlighting the component node according to a gradation range mapping, the gradation ranging between two limits of visual indicia (e.g. colors) and a minimum and maximum current loading magnitude respectively mapped to each limit. Preferably, alternative visually-distinct gradients are employed, one for "source" nodes of components where currents carried by interconnect segments originate and one for "sink" nodes of components where currents carried by interconnect segments are received. A designer can thereby more intuitively visualize the relative degree of actual current loading at the given source and sink nodes between which segments of interconnects extend. Furthermore, preferably, certain related nodes (based on one or more of various predetermined factors) are grouped together into "clusters" and highlighted according to the collective magnitudes of current load for the entire cluster.

For the purposes of this disclosure, unless otherwise noted, "electronic component" refers herein generally to a wide variety of electronic elements known in the art, including but not limited to active devices such as transistors and diodes; discrete elements such as capacitors, inductors, resistors; integrated subcircuits; or the like.

Such electronic components are interconnected at interconnection pins or other such circuit "nodes" between which "nets" are routed. For the purposes of this disclosure, unless otherwise noted, a "net" refers to electrically conductive material having one or more segments that extend to respective circuit nodes. All segments of the same net are disposed during circuit operation to be at the same instantaneous voltage (ideally), though they may conduct different magnitudes of current.

For the purposes of this disclosure, unless otherwise noted, a "current source" or "source" is used with reference to a circuit node (or portion of a circuit component) where a current flow through a particular net originates; and, a "current sink" or "sink" is used with reference to a circuit node (or portion of a circuit component) where a current flow through a particular net is received. A net therefore includes at least one source and at least one sink, with the current flowing from one to the other.

For the purposes of this disclosure, unless otherwise noted, a net or a segment thereof may be formed with any suitable conductive structure known in the art. This includes but is not limited to a printed "wire" or other conductive circuit routing known in the art.

For the purposes of this disclosure, unless otherwise noted, "current loading" refers to the current passed through a circuit node and/or net segment directly connected thereto. The polarity of this current depends on the current's relative direction (whether the particular circuit node is a current source or current sink) during circuit operation. Current loading in the illustrated embodiments preferably, though not necessarily, refers to the maximum current to be conducted by a given circuit node or net segment (or collectively by a cluster thereof), and the magnitude of current loading refers therefore to the magnitude of that maximum current. The current loading magnitude of a circuit node may be determined through simulated operation of the circuit design or portion thereof, and also in certain cases from predefined parameters of the circuit node or its component, or through the use of other suitable measures known in the art.

An electronic circuit product contains electronic components interconnected through circuit nodes by a plurality of nets routed therebetween. For the purposes of this disclosure, unless otherwise noted, the parts of a given electronic circuit design, including its components, nodes, and interconnections/nets, and all other unspecified parts are generally referred to herein as "circuit elements."

In the design process, a circuit schematic is preferably designed first; the schematic represents the electronic components and how they functionally interconnect without concern for physical size and spatial arrangement. At the schematic design stage, components are treated as if current passed directly from component to component, with little if any structural configuration or physical spatial arrangement of the interconnections and circuit nodes reflected.

A physical layout is generated further down in the design flow, which defines the physical "footprint" with the component suitably arranged and placed in the circuit, and nets routed between the circuit nodes associated to provide the requisite interconnections. The segments of the nets are established with suitable dimensional properties such as length, width, and contour. The layout therefore provides a spatial arrangement of the circuit elements of the design, including both electronic components and interconnections. The components are typically placed consistent with the schematic design and applicable design constraints on the available circuit real estate, and the interconnections suitably routed therebetween.

In a circuit editor, the physical layout is preferably graphically represented on a display, and a user interface provides for interactive user access to effect placement/routing operation and selectively configure/reconfigure the circuit elements in the layout.

Preferably, a circuit editor can compute a relationship between a maximum current on a wire and a minimum wire or interconnection width necessary to carry that current in safety, based on other factors which may include but are not limited to wire material, maximum expected operating temperature, and wire length.

According to one embodiment of the invention, the following formula computes the maximum safe current for a given wire:

$$I_{MAX} = K_M * K_T * K_L * (W - E)$$

where $K_M$ is a constant for a provided material and/or layer M (e.g. "metal layer 1" or "copper"), $K_T$ is a constant for a provided maximum operating temperature T (e.g. "100° C." or "300 K"), $K_L$ is a constant for a provided length range L (e.g. "between 5 μm and 10 μm" or "less than 5 μm" or "greater than 10 μm"), W is the wire width, and E is a margin for error. Preferably, a $K_M$ for each expected value or set of M, a $K_T$ for each expected value or range of T, a $K_L$ for each expected value or range of L, and E are all predefined in advance, for example by the chip manufacturer or by some manufacturing standard. Because safety is ultimately a subjective quality and is influenced by a variety of other factors, "preferred" values will vary wildly and will not be provided here, but those of skill in the art will be able to select suitable values.

The formula may be inverted to:

$$W_{MIN} = (I / K_M * K_T * K_L) + E$$

to determine a minimum wire width $W_{MIN}$ necessary to safely conduct a current I based on the other factors.

In an exemplary embodiment and illustrative application, a circuit layout editor is established. The circuit layout editor or related software generates a graphic rendering of the layout of an electronic circuit design, or a portion thereof, which is visually rendered on a display. FIG. 1A depicts an illustrative example of a circuit layout representing a portion of a circuit, as it would be presented in a circuit layout editor in an early (pre-interconnection) stage of the layout design process, according to an embodiment of the invention.

As is common practice in the art, this disclosure will refer to the current loading magnitudes of sources with a negative value, and the current loading magnitudes of sinks with a positive value. However, when comparing current loading magnitudes, for convenience and brevity, it will be assumed that the absolute values of the magnitudes are being considered unless otherwise noted.

For example, −1.1 mA is "greater in magnitude" than both −0.5 mA and 0.2 mA, but "lesser in magnitude" than either −1.5 mA or 1.2 mA. Additionally, of those five values, the "maximum current loading" is −1.5 mA and the "minimum current loading" is 0.2 mA.

In the example graphic rendering of FIG. 1A, a net 100 of the design has been selected and highlighted in white. Net 100 is connected to circuit nodes including a first group of transistor pins 110, a second group of transistor pins 120, a pair of capacitor pins 130, a third group of transistor pins 140, a fourth group of transistor pins 150, and a top level pin 160. Interconnections between the components of the net (more specifically, between their circuit nodes) are also depicted; however, these are provided solely as visual cues in the circuit layout editor to generally indicate the flow of current, and do not represent actual routing.

In FIG. 1A, the current loading magnitude of any given component at a circuit node, or even which circuit nodes are sources and which are sinks, is unclear. While this information may be determined from the circuit schematic using existing measures known in the art, it is not presented in the layout as displayed. Therefore, FIG. 1B depicts the illustrative example of a circuit layout of FIG. 1A, with a color-based highlighting applied to and superimposed upon the circuit nodes of net 100, according to an embodiment of the invention.

Two color-based gradation ranges are also depicted in the example graphic rendering of FIG. 1B for reference. In the depicted example, source gradation range 11 is in this example graduated from a blue (0x0000FF in hexadecimal color value) "maximum" color 11*a* to a cyan (0x00FFFF) "minimum" color 11*b*, and sink gradient 13 is in this example scaled from a red (0xFF0000) "maximum" color 13*a* to yellow (FFFF00) "minimum" color 13*b*.

Each gradation range may set any two preselected colors as range limits, and increment from one to the other across a segment of any color spectrum, whether based on RGB values, CYMK values, or some other representation that can be incremented from one limit to the other. Indeed, any type of visual qualities that can be incremented one to the other across a visual spectrum may be preselected for the limits of a gradation range. As but a few illustrative examples known in the art, the gradation ranges may be according to density of shading, dot-shading, or hatching; thickness of an outline; or "depth" of a "beveling" effect or other visual effect. However, for purposes of convenience and brevity, it will be assumed hereinafter that both gradation ranges employ colors, and more specifically those of the depicted example of FIG. 1B, unless otherwise specified.

The two limits of the source gradation range 11 preferably have respectively mapped thereto a minimum source current magnitude (preferably, zero) and a maximum source current magnitude (preferably, the largest magnitude of current loading among the source nodes of the selected net). Likewise, the two limits of the sink gradation range 13 preferably have respectively mapped thereto a minimum sink current magnitude (preferably, zero) and a maximum sink magnitude (preferably, the largest magnitude of current loading among the sink nodes of the selected net). For the purposes of this disclosure, the gradation range limit 11*a* having the maximum source current magnitude mapped thereto is termed the "maximum source limit," the gradation range limit 11*b* having the minimum source current magnitude mapped thereto is termed the "minimum source limit," the gradation range limit 13*a* having the maximum sink current magnitude mapped thereto is termed the "maximum sink limit," and the gradation range limit 13*b* having the minimum sink current magnitude mapped thereto is termed the "minimum sink limit."

A single gradation range, with one limit mapped to a maximum source current magnitude and the other limit mapped to a maximum sink current magnitude, is within the scope of the invention. However, for reasons of greater visual clarity, separate source and sink gradation ranges each defined in different, visually-distinguishable segments of the color spectrum (or other visual spectrum, for non-color-based gradations) are preferred. For purposes of convenience and brevity, alternative gradation ranges respectively associated with sources and sinks will be assumed hereinafter unless otherwise specified, but those of skill in the art will be able to apply the principles herein to a single gradation range.

Using this mapping, specific colors within the gradation ranges map to specific current loading magnitudes. Preferably, the circuit editor highlights circuit nodes, or their components in certain embodiments, in a displayed part of the electronic circuit design, with colors from the gradation ranges according to the mapping of the magnitudes for those electronic components.

The colored highlighting therefore serves as visual indicia for those magnitudes, and preemptively indicates the current loading magnitudes at each circuit node before the interconnections are routed, as can be seen in the example of FIG. 1B. For example, based on the highlighting depicted in FIG. 1B, it can be intuitively seen that:

1. The first and second groups of transistor pins 110 and 120, highlighted primarily in blue (that is, 0x0000FF; a lighter shade of roughly 0x0066FF highlights the leftmost transistor pin of each), are all sources, and each pin passes a relatively large amount of current loading compared to the sources of the net as a whole.

2. The capacitor pins 130 and third group of transistor pins 140, highlighted in a dark cyan (roughly 0x00CCFF), are all sources, and each pin passes a relatively small amount of current loading compared to the sources of the net as a whole.

3. The fourth group of transistor pins 150, highlighted in red (0xFF0000), are all sinks, and each pin passes a relatively large amount of current loading compared to the sinks of the net as a whole.

4. The top level pin 160, highlighted in dark orange (roughly 0xFF6600), is a sink, and passes a relatively mid-level amount of current loading compared to the sinks of the net as a whole.

Figure 1C:
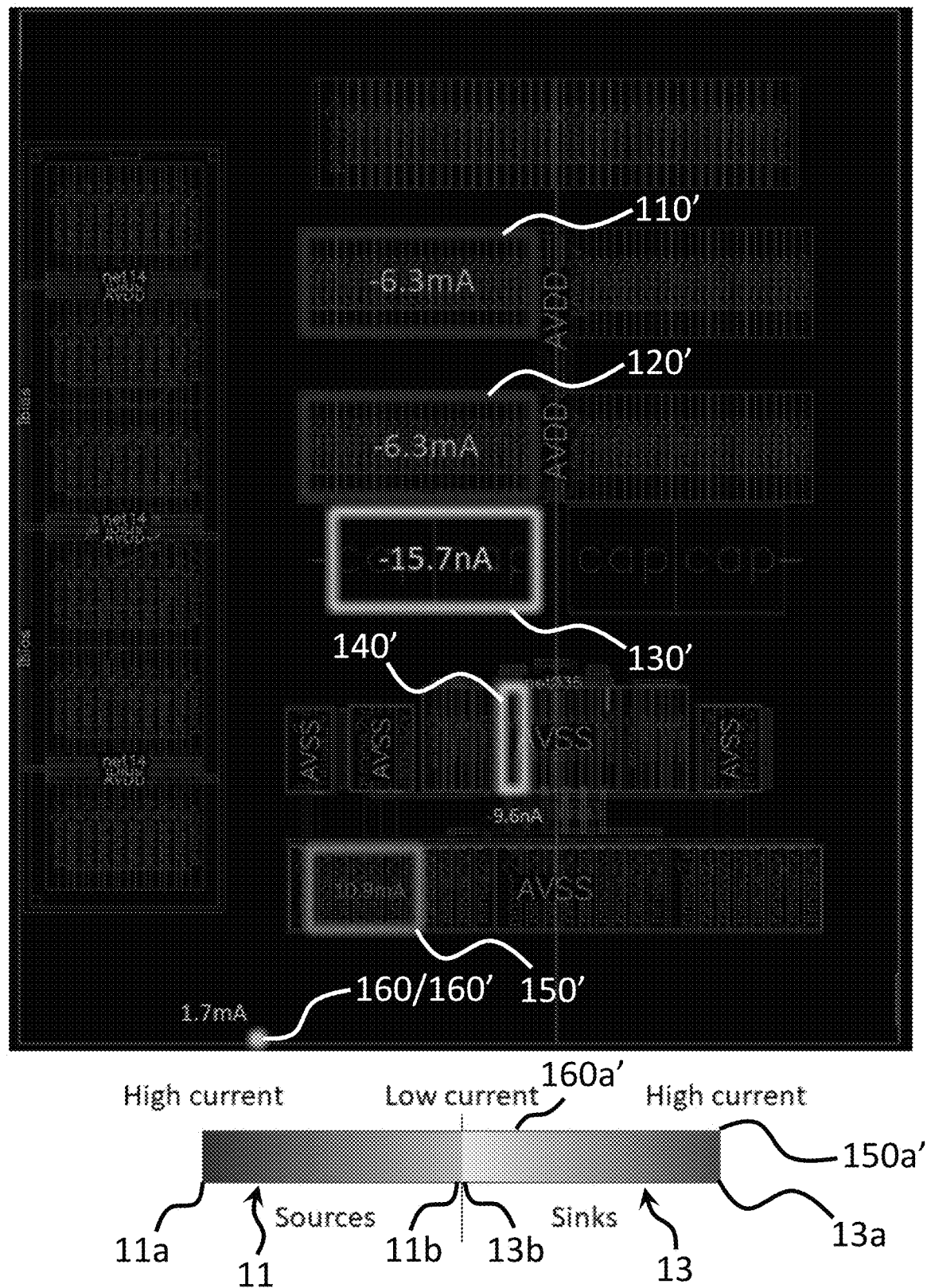
FIG. 1C is a depiction of the rendered circuit layout of FIG. 1A, with visual indicia applied to clusters of components thereof, in accordance with an exemplary embodiment of the invention.

Further clarification can be provided by selectively grouping the individual circuit nodes. FIG. 1C depicts the illustrative example of a circuit layout of FIG. 1A using the color-based highlighting of FIG. 1B applied to "clusters" of the circuit nodes of net 100, according to an embodiment of the invention. The nodes in each group (e.g. first group of transistor pins 110) of FIGS. 1A and 1B may be connected for example to a section of the net having multiple branches emerging from a common portion of the net. The nodes of each group are therefore, for the purposes of determining necessary interconnections, preferably combined into a cluster, according to methods which will be described further herein. That is, the first, second, third, and fourth groups of transistor pins 110, 120, 140, and 150 are grouped into first, second, third, and fourth clusters of transistor pins 110', 120', 140', and 150'; and the pair of capacitor pins 130 is grouped into a cluster of capacitor pins 130'. Top level pin 160 remains isolated from other pins; however, it is preferably treated as a pin cluster 160' containing a single node in the depicted embodiment.

With the clusters established, each cluster is then treated as having a single current loading magnitude for the purposes of mapping current loading magnitudes to gradation ranges 11 and 13 and applying the visual indicia. That is, the colors represent the cluster as a whole, and the visual indicia are visibly applied to the cluster as a whole. The current loading of the cluster is collectively defined by the individual nodes within, and is preferably the sum of the current loading of those individual nodes.

As can be seen in FIG. 1C, based solely on the clustering and highlighting, it can be intuitively seen that:

1. The first and second clusters of transistor pins 110' and 120', highlighted in blue (0x0000FF), are both source clusters, and each cluster collectively passes a relatively large amount of current loading compared to the source clusters of the net as a whole.

2. The cluster of capacitors 130' and the third cluster of transistors 140', highlighted in a dark cyan (roughly 0x00CCFF), are both source clusters, and each cluster collectively passes a relatively small amount of current loading compared to the source clusters of the net as a whole.

3. The fourth cluster of transistors 150', highlighted in red (0xFF0000), is a sink, and collectively passes a relatively large amount of current loading compared to the sink clusters of the net as a whole.

4. The pin cluster 160', highlighted in dark yellow (roughly 0xFFCC00), is a sink cluster, and consumes a relatively small amount of current loading compared to the sink clusters of the net as a whole.

The visible shift in highlighting color for pin cluster 160' in this example, relative to top level pin 160 of FIG. 1B, is due to a shift in the mapping of current loading magnitudes resulting from the clustering. In the example layout of FIGS. 1B and 1C, top level pin 160 passes 1.7 mA of current loading, which is relatively close to the 2.7 mA of current loading passed by any one transistor pin in the fourth group of transistor pins 150. Therefore, for the non-clustered magnitudes considered in the example of FIG. 1B, the maximum sink current magnitude throughout the circuit nodes of the selected net is 2.7 mA, which is mapped, as per indicator 150a, to the maximum sink limit 13a of 0xFF0000 (red). On a linear scale between 0 and 2.7 mA, the 1.7 mA of top level pin 160 maps to indicator 160a, within the upper half of the gradation range, and has visual indicia of a corresponding color. However, the fourth cluster of transistor pins 150' collectively passes 10.9 mA. Therefore, for FIG. 1C, the sink gradation range 13 is re-mapped, with 10.9 mA now mapped to the maximum sink limit 13a, as per indicator 150a'. As a result, on a linear scale between 0 and 10.9 mA, the 1.7 mA of pin cluster 160' maps to indicator 160a' which is within the lowest fourth of the gradation range, and has visual indicia of a corresponding color.

(It is noted that the source gradation range 11 is also re-mapped in a substantially identical manner, according to the larger current loading magnitudes of the source clusters 110', 120', 130', and 140'. However, in the depicted example, this does not noticeably alter the relative mappings of magnitudes to the source gradation range 11, or the resulting colors of the visual indicia.)

An additional advantage of clustering is that a cluster is usually visibly larger than its individual circuit nodes, and therefore more easily labeled with text such that the label is clearly associated with the cluster. Therefore, in the embodiment depicted in FIG. 1C, the various clusters are labeled with graphic annotations which display their current loading magnitudes. However, alternate embodiments, or alternate configurations of embodiments according to user input, omit these annotations, or provide different information. It is also noted that certain embodiments and configurations provide these or similar annotations for individual circuit nodes, either in combination with the annotations for the clusters or by themselves.

Figure 1D:
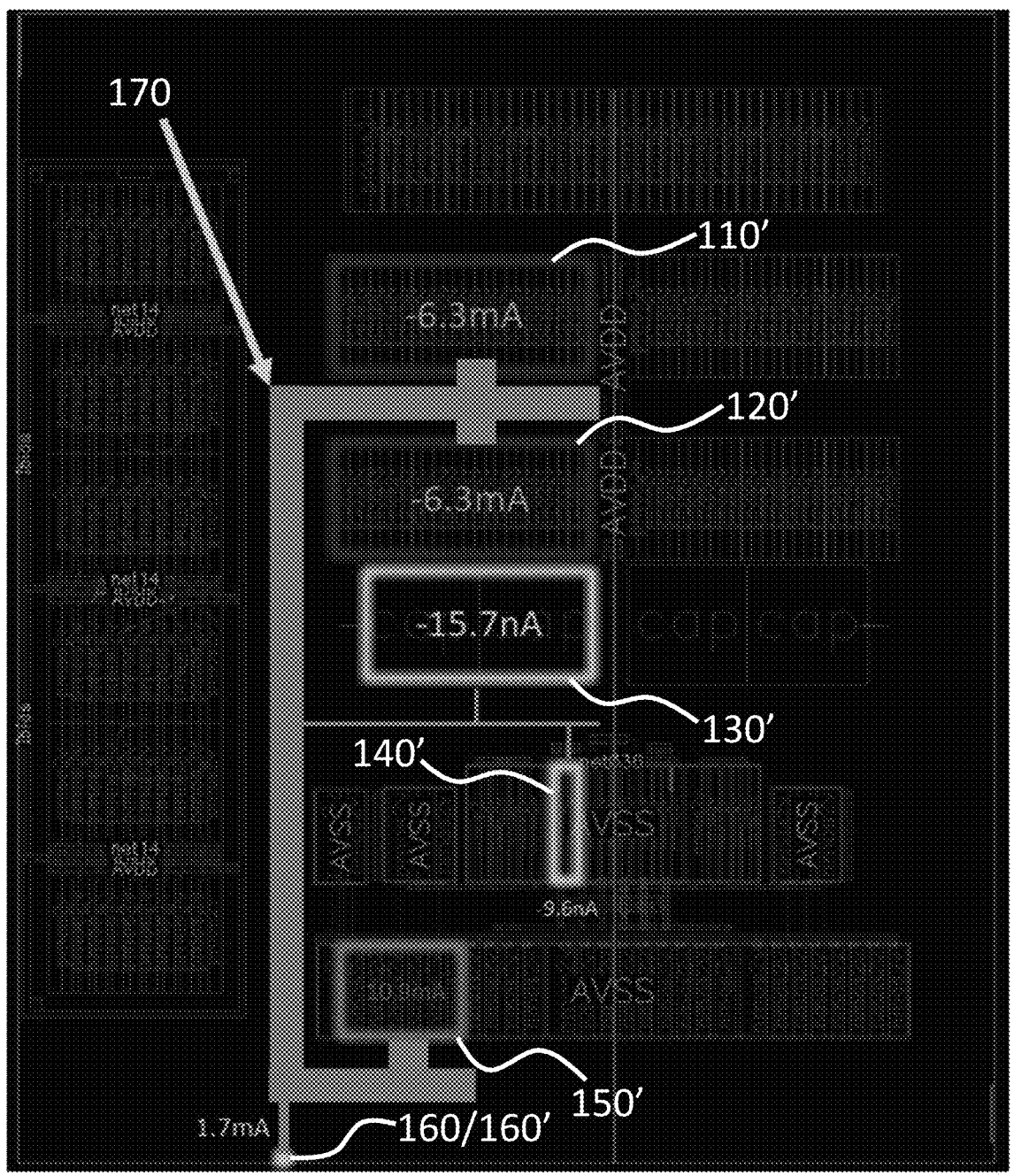
FIG. 1D is a depiction of the rendered circuit layout with visual indicia of FIG. 1C, with interconnection routing added, in accordance with an exemplary embodiment of the invention.

With the current loading magnitudes for each cluster intuitively presented in a visual manner, a designer can more easily envision the interconnections necessary for the net, and better estimate how much spacing will be required. For example, the cluster of capacitor pins 130' and the third cluster of transistor pins 140' will require relatively narrow interconnections to manage the current flow of their small current loading, while the first and second clusters of transistor pins 110' and 120' will require relatively large interconnections. FIG. 1D depicts one illustrative routing of interconnections for the illustrative example of a circuit layout of FIG. 1A, according to an embodiment of the invention. In FIG. 1D, a prospective routed net 100' includes a series of distinct net segments, or net portions, shown in a prospective routing to interconnect pins of certain circuit components. FIG. 1D also depicts the color-based highlighting of clusters as in FIG. 1C, and it can be seen that the widest segments of routed net 100' correspond to the clusters 110', 120', and 150' highlighted with the colors of the maximum source and maximum sink limits 11a, 13a, in compliance with the minimum safe wire width. Prior to actually routing the net 100', the highlighting provides a reference which allows a designer to proportionately size the appropriate segments of the selected net, and the spacing which will be required to fit those segments. For example, a designer can easily determine that a relatively wide spacing will be required for the interconnection segments routed to these clusters 110', 120', and 150', and can adjust the positions of the electronic components accordingly before sizing and routing the net and its segments. Additionally, while routing the net, a designer can adjust the width of specific segments of the net in expectation that a wider wire will (or will not) be necessary when connecting a specific circuit node to the net, even before simulating the design to confirm this expectation.

Figure 2A:
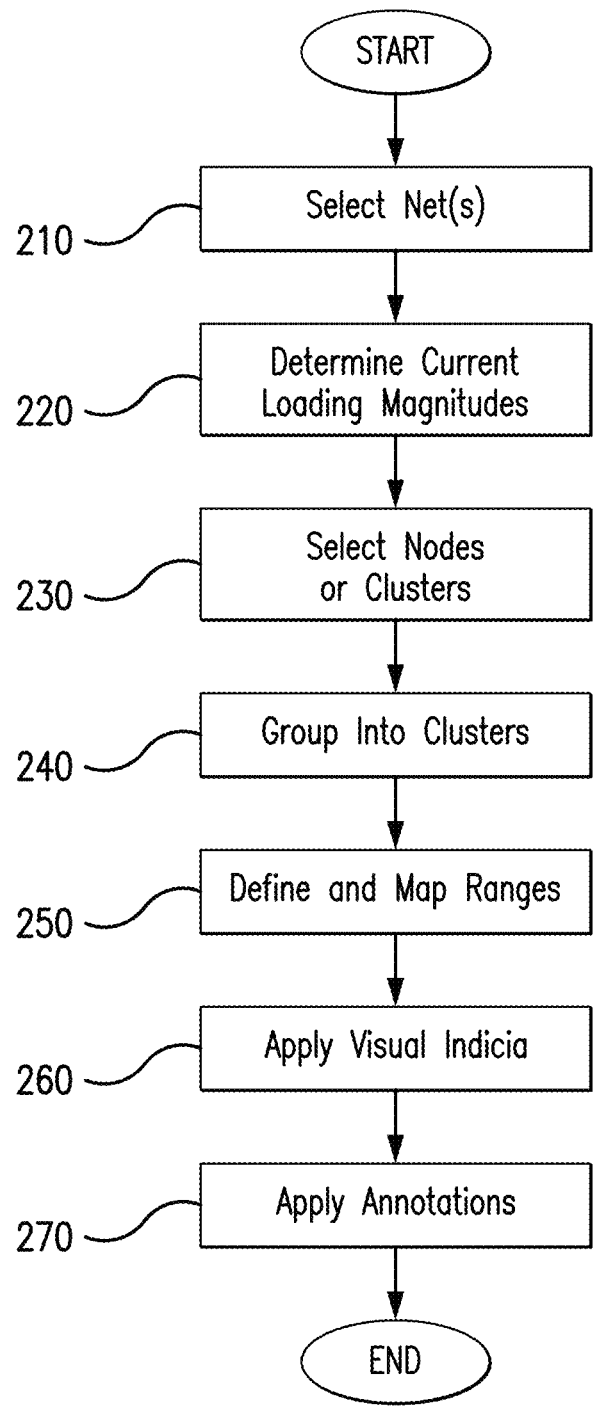
FIG. 2A is a flow diagram illustrating a flow of processes to generate visual indicia of current loading magnitudes to a layout in a circuit layout editor, in accordance with an exemplary embodiment of the invention.

FIG. 2A depicts a method of applying visual indicia of current loading magnitudes to a layout in a circuit layout editor, according to an exemplary embodiment of the current invention.

In the depicted embodiment, at 210, one or more nets are selected. In alternate embodiments and configurations, the operations of the method are conducted for circuit nodes of some other portion of the layout, or of the layout as a whole.

At 220, the current loading magnitude at one or more of the circuit nodes corresponding to the selected nets is determined. That is, it is determined for the node whether it is a sink or a source, and what the magnitude of its current loading is. Preferably, this determination is made for each node of the selected nets. In certain embodiments this information is already known and available from a table, while in alternate embodiments it is determined by a simulation of the design. Various suitable methods in accordance with each approach, and others, are known in the art and will not be elaborated upon further.

At 230, the user selects whether to map, scale, and highlight based on individual nodes or on clusters. In certain embodiments, this is a configuration set in advance. In certain embodiments, other configuration settings such as scaling settings (described further with reference to FIGS. 4A and 4B) and annotation settings (described further with reference to FIG. 5) are also selected.

At 240, the circuit nodes of the selected nets are grouped into clusters. This operation is in certain embodiments omitted if the user has chosen at 230 to highlight based on individual nodes, but in alternate embodiments and configurations the clustering is performed regardless, as a user may wish to revisit 230 and change the selection.

Figure 2B:
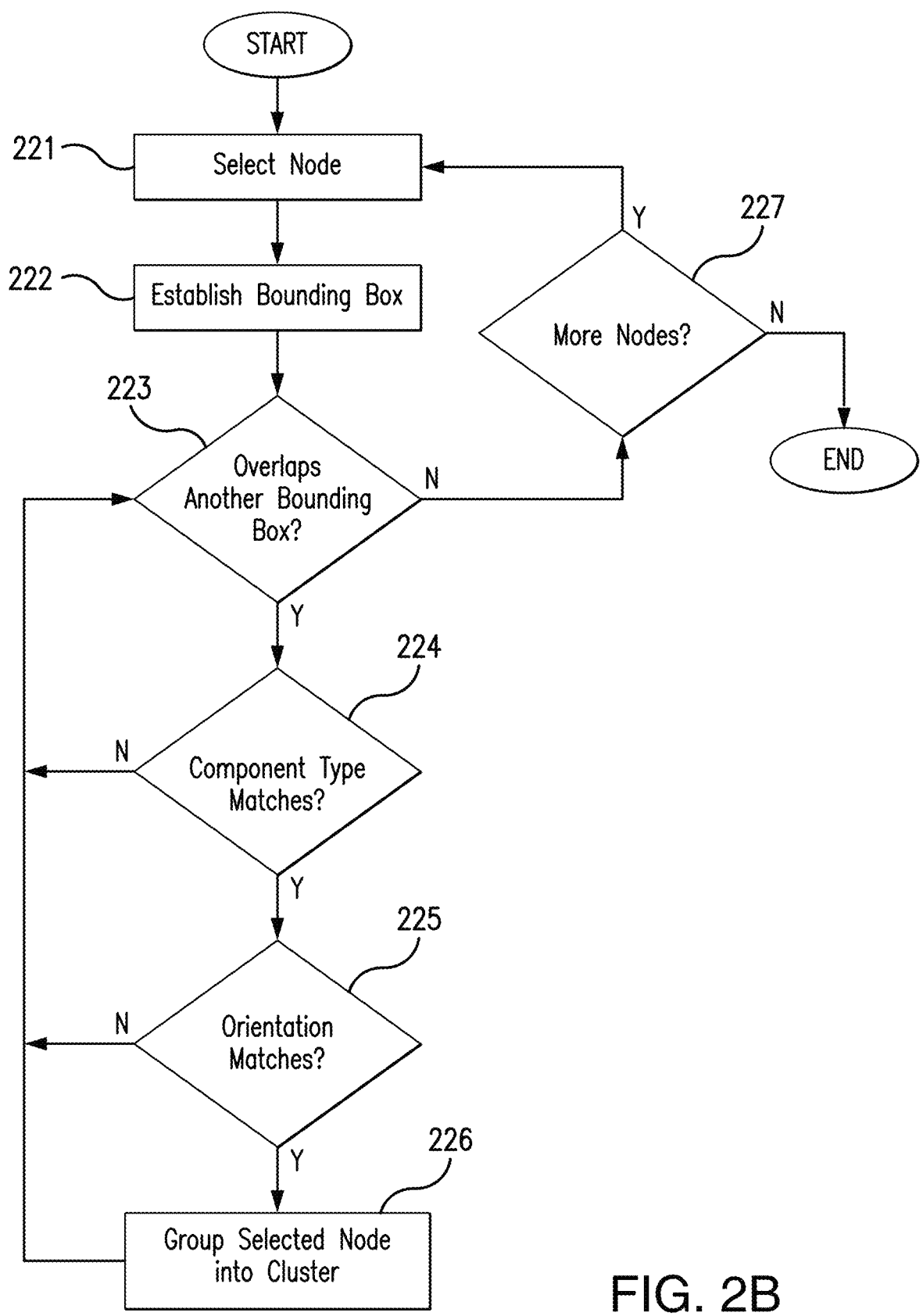
FIG. 2B is a flow diagram illustrating a flow of processes for grouping a plurality of components of a net into a cluster, in accordance with an exemplary embodiment of the invention.

In certain embodiments, clustering is performed in accordance with a method, as depicted in FIG. 2B, of grouping a plurality of circuit nodes of a net into a cluster.

According to the embodiment depicted in FIG. 2B, a circuit node that the selected net or nets couples to is selected at 221. The node can be selected arbitrarily, so long as it has not been selected in a previous iteration of 221, but in one embodiment is the closest node, of all nodes not previously selected, to the node selected immediately previous.

At 222, a bounding box is established around the component having the selected circuit node. The bounding box is preferably a substantially identical shape to the component itself, but greater in size by some predetermined absolute or percentage value. As but one illustrative example, the bounding box is in one embodiment 150% the size of the component itself. In a preferred embodiment, the bounding box is centered on the center of the component, but in alternate embodiments, the bounding box is centered on the selected circuit node.

At 223, it is checked whether the bounding box overlaps with another bounding box previously established for another circuit node of the selected net. If this is true, the two components, or their circuit nodes, are within a relative proximity of each other (or, in some cases, the circuit nodes of each bounding box are part of the same component). For the first iteration, this will never be true, as no other bounding boxes for other circuit nodes have been established yet. In later iterations of 223, bounding boxes may overlap. If no bounding box overlaps with the present bounding box, the method proceeds to 227 to check whether there are more nodes of the net to select; if there are, the method loop returns to 221 to select the next node, and if not, the method ends.

When the bounding box for the selected node overlaps with a bounding box for another circuit node, two additional checks on the pair of nodes are considered at 224 and 225. Namely, at 224, it is determined whether the electronic components respectively associated with the two nodes match in component type: for example, if they are both transistors, resistors, capacitors, or some other specific type of component. At 225, it is checked whether the pair of nodes match in relative directional orientation: that is, if the nodes, due to their position on their respective components, are both accessible from the same direction, due to having matching orientation within a predetermined difference of angle (preferably below 45°), and therefore can be connected to the net through the same net segment. If one or the other is not the case, the method returns to 223 to see if another bounding box overlaps with the present bounding box. However, if both 224 and 225 are the case, the presently selected node is grouped into a cluster which contains the node having the overlapping bounding box at 226, before returning to 223 to look for additional overlapping bounding boxes. If the node having the overlapping bounding box is already part of a cluster, the presently selected node joins that existing cluster; otherwise, a new cluster is formed. If the presently selected node is already part of a cluster at 226, for instance due to a previous iteration of 226, and the overlapping node is also already part of a cluster, the two clusters are merged into a single cluster containing all nodes of both clusters.

It is again noted that, in most embodiments, a single node not yet clustered with another node will be treated as a cluster containing one circuit node for all purposes, making the distinction between "clustered" and "unclustered" irrelevant. Hereinafter, it will be assumed that each node of the selected net begins the method of FIG. 2B treated as a cluster of one circuit node.

Figure 3A:
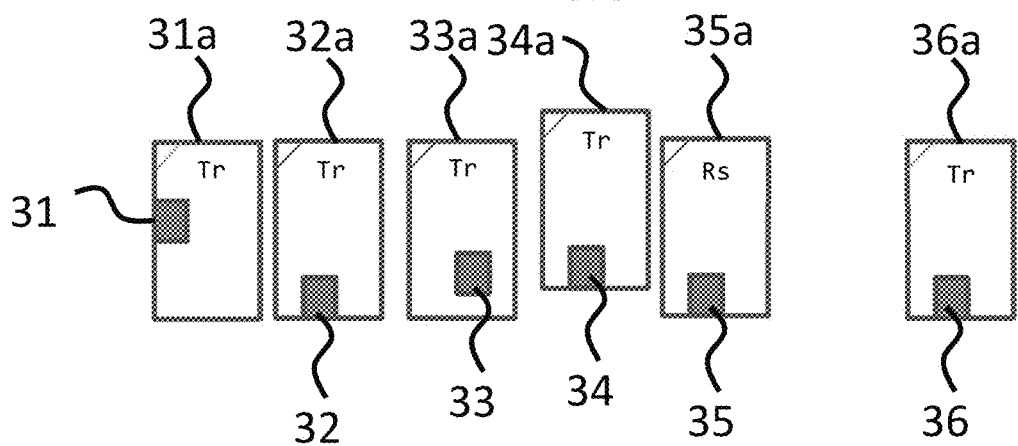
FIGS. 3A-3C are schematic diagrams illustrating an example of an arrangement of electrical components at various stages of the clustering processes of FIG. 2B, in accordance with an exemplary embodiment of the invention.
Figure 3B:
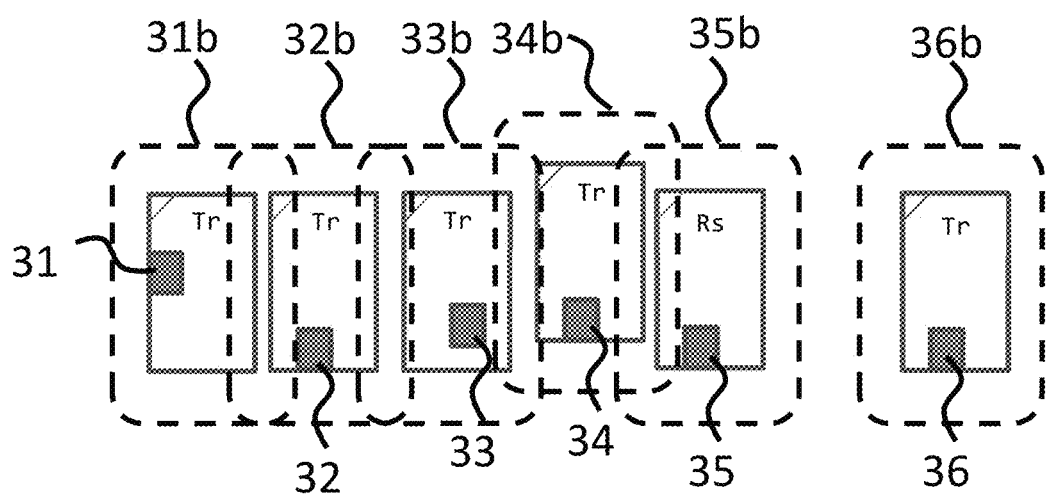
Figure 3C:
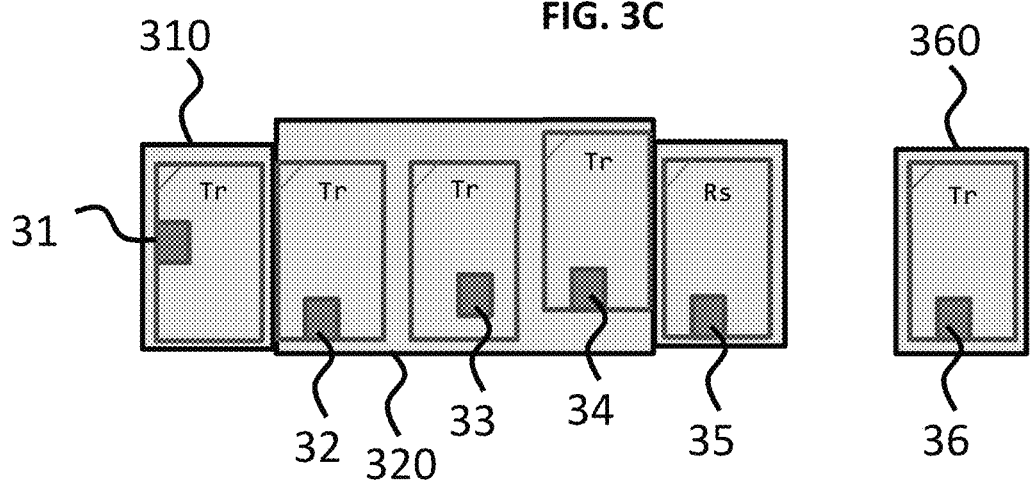

An example application of this method is depicted in FIGS. 3A-3C, as applied to an illustrative example of an arrangement of electrical components. For convenience, each electrical component has only one circuit node, but those of skill in the art will be able to apply the principles herein to components having a plurality of circuit nodes. In FIG. 3A, a plurality of circuit nodes includes transistor pins 31, 32, 33, 34, and 36, and resistor pin 35. These circuit nodes are respectively part of transistors 31a, 32a, 33a, 34a, and 36a, and resistor 35a, which are arranged in a circuit layout.

As depicted in FIG. 3B, bounding boxes 31b-36b are applied to the electronic components 31a-36a of circuit nodes 31-36, according to operation 222 of FIG. 2B.

In the depicted example, transistor pin 31 is (arbitrarily) selected first in the method of FIG. 2B, at 221 and its bounding box 31b is established at 222. At 223, because no other bounding boxes have been established yet, no bounding boxes overlap bounding box 31b. Therefore, the method proceeds to 227 immediately, then to 221 to select the next node.

Transistor pin 32 is selected next and its bounding box 32b established. Bounding box 32b is found at 223 to overlap with the bounding box 31b for transistor pin 31, so the method continues to 224. The components of the two pins also have matching type, both being transistors, and so the method continues to 225. However, transistor pin 31 faces to the left relative to its component 31a, while transistor pin 32 faces down relative to its component 32a, which is a mismatch of directional orientation. Therefore, the check at 225 fails, and the method returns to 223, then to 227 and 221 as there are no other established bounding boxes overlapping with bounding box 32b.

Transistor pin 33 is selected next and its bounding box 33b established. Bounding box 33b is found at 223 to overlap with the bounding box 32b for transistor pin 32, so the method continues to 224. Their two components 32a and 33a also have matching type, both being transistors, and so the method continues to 225. Finally, the nodes 32 and 33 have matching directional orientation, both facing downward relative to their components 32a and 33a, and so the method continues to 226. Therefore, at 226, transistor pin 33 is grouped into the cluster of transistor pin 32, which previously simply contained transistor pin 32. The method then returns to 223, then to 227 and 221 as there are no other established bounding boxes overlapping with bounding box 33b (bounding box 31b exists but does not overlap).

Transistor pin 34 is selected next and its bounding box 34b established. Bounding box 34b is found at 223 to overlap with the bounding box 33b for transistor pin 33, so the method continues to 224. Their two components 33a and 34a also have matching type, both being transistors, and so the method continues to 225. Finally, the nodes 33 and 34 have matching directional orientation, both facing downward relative to their components 33a and 34a, and so the method continues to 226. Therefore, at 226, transistor pin 34 is grouped into the cluster of transistor pin 33; this cluster already also included transistor pin 32, and the resulting cluster 320, depicted in FIG. 3C, now contains transistor pins 32, 33, and 34. The method then returns to 223, then to 227 and 221 as there are no other established bounding boxes overlapping with bounding box 34b. It is noted that, in the depicted method of 2B, positional alignment of pins, or of their components, is not a clustering criteria. In alternate embodiments where positional alignment of pins or components is a clustering criterion, it is possible that transistor pin 34 or transistor 34a is sufficiently out of positional alignment with transistor pin 33 or transistor 33a that a check thereof fails and clustering does not occur.

Resistor pin 35 is selected next and its bounding box 35b established. Bounding box 35b is found at 223 to overlap with the bounding box 34b of transistor pin 34, so the method continues to 224. However, their two components 34a and 35a do not match in type, as one is a transistor and one is a resistor. Therefore, the check at 224 fails, and the method returns to 223, then to 227 and 221 as there are no other established bounding boxes overlapping with bounding box 35b.

Transistor pin 36 is selected next and its bounding box 36b established. Bounding box 36b is found at 223 not to overlap with any bounding boxes. Therefore, the check at 223 fails and the method returns to 227.

At this point, all components in the example arrangement have been selected in a previous iteration of 221. Therefore, the check at 227 fails and the method ends.

FIG. 3C depicts an end result of the method of FIG. 2B applied to the component arrangement of FIG. 3A. In FIG. 3C, one cluster 320 contains transistor pins 32, 33, and 34, and transistor pin 31, resistor pin 35, and transistor pin 36 each have their own "clusters of one" 310, 350, and 360, respectively. It can be seen that a different order of selection of the circuit nodes would have produced a substantially identical result.

Variations on this method, and other suitable methods of grouping circuit nodes based on predetermined clustering criteria, can also be imagined by those of skill in the art based on the disclosures herein.

Much of the remaining description is equally applicable to circuit nodes and to clusters. In particular, most of the methods that follow can be applied either to circuit nodes or to clusters, based solely on the selection 230 of FIG. 2A. Therefore, hereinafter, both source nodes and source clusters will be referred to as "sources," and both sink nodes and sink clusters will be referred to as "sinks," save where the distinction between the two is relevant.

Returning to FIG. 2A, at 250, gradation ranges are defined for preselected colors (or other visual indicia), and corresponding current loading magnitudes are mapped to the gradation ranges.

Figure 2C:
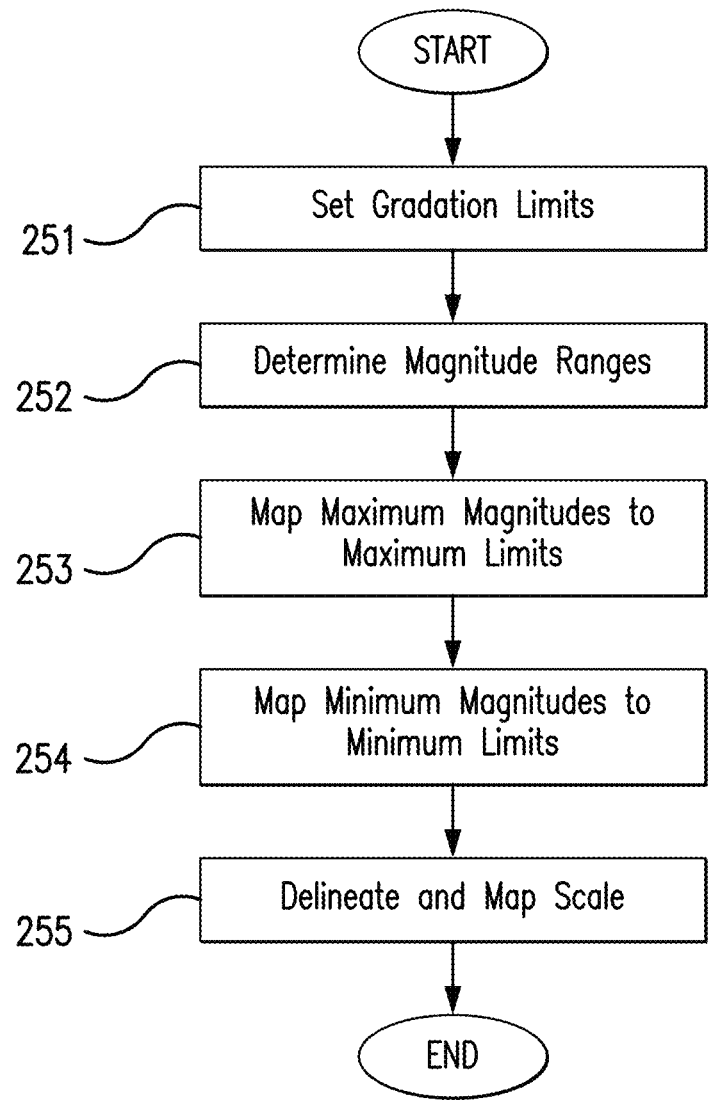
FIG. 2C is a flow diagram illustrating a flow of processes for mapping a range of magnitudes to a gradation range, in accordance with an exemplary embodiment of the invention.

In certain embodiments, this mapping is performed in accordance with a method, depicted in FIG. 2C, of mapping a range of magnitudes to a gradation range.

According to the method of FIG. 2C, at 251, the gradation range limits are set. For instance, as previously described for the example gradation range used in FIGS. 1B-ID, the maximum source limit 11a is set to blue, the minimum source limit 11b is set to cyan, the maximum sink limit 13a is set to red, and the minimum sink limit 11b is set to yellow. As previously noted, the gradation ranges are not limited to these colors or even to any colors at all, but can be of any visual indicia of preselected type that can visually progress from one to another over a gradation range.

At 252, the applicable ranges of current loading magnitudes are determined. The current loading magnitudes were previously determined at 220 of the method of FIG. 2A; these magnitudes are now organized into the appropriate magnitude ranges. As one illustrative example, four current sources are connected to a net, and are determined to have current loading magnitudes of −1.2 mA, −1.0 mA, −0.5 mA, and −0.01 mA, while four current sinks are also connected to the net, and are determined to have current loading magnitudes of 2 mA, 0.5 mA, 0.1 mA, and 0.01 mA.

At 253, a maximum magnitude in each of the source and sink magnitude ranges is mapped to the corresponding maximum limits for the source and sink gradation ranges. In the illustrative example, the source maximum is −1.2 mA, and the sink maximum is 2 mA. This mapping results in relative scales for the gradation ranges, different in range from each other, which may be preferable when comparing sources with each other, or comparing sinks with each other. However, in an alternative embodiment or configuration, the maximum absolute value of both magnitude ranges is mapped to the sink maximum limit, and the negative of the maximum absolute value of both magnitude ranges is mapped to the source maximum limit. This mapping results in absolute scales for the gradation ranges, equivalent (but opposite) in range to each other, which may be preferable when comparing sources with sinks. In the illustrative example, the maximum absolute value for the source and sink ranges combined is 2 mA, and therefore 2 mA is mapped to the sink maximum limit, and its negative, −2 mA, is mapped to the source maximum limit.

At 254, the magnitude range minimums are mapped to the respective minimum limits for the gradation ranges. In certain embodiments, the magnitude range minimums are minimum magnitudes found in the respective magnitude ranges, which in the illustrative example are −0.01 mA for the source magnitude range and 0.01 mA for the sink magnitude range. However, in a preferred embodiment, both magnitude range minimums are set to zero, regardless of the values of the various current loading magnitudes in the magnitude ranges.

Finally, at 255, the scale between the limits of each gradation range is delineated and the remaining magnitudes are mapped according to the scale. In certain embodiments and configurations, this scale increments linearly, where the magnitude mapped to the middle of a gradation range is the mean average of the magnitudes at each limit. For example, a linear gradation range with the maximum limit mapped to 2 mA and the minimum limit mapped to 0 mA will always have a middle gradation value mapped to 1 mA. However, in alternate embodiments and configurations, a distributed scale is used. A distributed scale increments nonlinearly, and preferably in accordance with the distribution of current loading magnitudes in the corresponding magnitude range, such that the median of the magnitude range is mapped to the middle of the gradation range.

FIG. 4A depicts gradation ranges scaled according to three combinations of these configurations, using the illustrative example magnitudes for each. Namely, as above, the range of source current loading magnitudes is −1.2 mA, −1.0 mA, −0.5 mA, and −0.01 mA, and the range of sink current loading magnitudes is 2 mA, 0.5 mA, 0.1 mA, and 0.01 mA.

An example relative linear scale 410 includes a source gradation range 411 and a sink gradation range 413. Source gradation range 411 has a maximum limit 411a, set to the color blue, and the maximum magnitude of the source magnitude range, −1.2 mA, is mapped thereto. (As stated above, current loading magnitude comparisons will be in terms of their absolute values for convenience, unless stated otherwise.) Sink gradation range 413 likewise has a maximum limit 413a, set to the color red, and the maximum magnitude of the sink magnitude range, 2.0 mA, is mapped thereto. Both gradation ranges also have minimum limits 411b, 413b, which are respectively set to cyan and yellow. 0 mA is preferably mapped to both minimum limits, although in alternate embodiments minimum magnitudes of the corresponding magnitude ranges (−0.01 mA and 0.01 mA, respectively) are mapped thereto. Both gradation ranges linearly progress in color from the maximum limit to the minimum limit: blue to cyan for the source gradation range 411, red to yellow for the sink gradation range 413. The magnitudes mapped to the source gradation range 411 increment linearly between the maximum of −1.2 mA and the minimum of 0 mA, such that the mean average of the two, −0.6 mA, maps to the midpoint of the gradation range, 411c. Likewise, the mapping to the sink gradation range 413 increments linearly between the maximum of 2.0 mA and the minimum of 0 mA, such that the mean average of the two, 1.0 mA, maps to the midpoint of the gradation range, 413c.

An example absolute linear scale 420 includes a source gradation range 421 and a sink gradation range 423. The selection and progression of colors in the gradation ranges are substantially identical to those for relative linear scale 410, and 0 mA is preferably mapped to both source and sink minimum limits 421*b* and 423*b*. However, to determine the magnitudes mapped to the source and sink maximum limits 421*a* and 423*a*, the maximum of the absolute values of all current loading magnitudes, both source and sink, is determined, then that absolute value is mapped to the sink maximum limit 423*a* and its negative is mapped to the source maximum limit 423*b*. In this example, of the eight magnitudes, the maximum according to absolute value is 2.0 mA, so its absolute value (also 2.0 mA) is mapped to the sink maximum limit 423*a* and the negative of its absolute value, −2.0 mA, is mapped the source maximum limit 423*b*. The mapping then increments linearly as in relative linear scale 410. It can be seen that this will result in a sink gradation range 423 identical to sink gradation range 413, the range in relative linear scale 410 with the larger magnitude mapped to its maximum, and a source gradation range 421 with a mapping that is a mirror image of sink gradation range 423.

An example relative distributed scale 430 includes a source gradation range 431 and a sink gradation range 433. The selection and progression of colors in the gradation ranges are substantially identical to those for in relative linear scale 410. Also as in the relative linear scale 410, source maximum limit 431*a* is mapped to the maximum magnitude of the source magnitude range, −1.2 mA, and sink maximum limit 433*a* is mapped to the maximum magnitude of the sink magnitude range, 2.0 mA. However, both minimum limits 431*b*, 433*b* are preferably mapped to the minimum magnitudes of the corresponding magnitude ranges: source minimum limit 431*b* to −0.01 mA and sink minimum limit 433*b* to 0.01 mA (although this distinction from relative linear scale 410 is not clearly visible in the figure). Additionally, the gradation range values are mapped nonlinearly to the current loading magnitudes. Specifically, in this example, the remaining two unmapped source magnitudes, −1.0 mA and −0.5 mA, are evenly distributed over the mapping to the source gradation range 431, placing the first at roughly 431*c* and the second at roughly 431*d*. Likewise, the remaining two unmapped sink magnitudes, 0.5 mA and 0.1 mA, are evenly distributed over the mapping to the sink gradation range 433, placing the first at roughly 433*c* and the second at roughly 433*d*. Variants on these non-linear distributions may also be conceived by those of skill in the art.

An absolute distributed scale is also within the scope of the invention. However, this combination is frequently not preferred for an absolute distributed scale. For example, when mapping the example ranges of magnitudes described above, −2.0 mA will be mapped to the maximum source limit, but this is well outside the provided source magnitude range. In certain embodiments, this can be resolved by making −2.0 mA an effective fifth magnitude in the distribution and adjusting accordingly. Also, in certain embodiments, non-linear distributions other than that described for the example relative distributed scale 430 may be used; these may be conceived by those of skill in the art. Additionally, the distribution described for the example relative distributed scale 430 may be more effective depending on the provided magnitude ranges.

As noted previously, more than one net can be selected at once. If so, in certain embodiments and configurations, the two nets are considered separately with their own mappings. However, in a preferred embodiment and configuration, the source and sink magnitude ranges include all current loading magnitudes from the nodes of all selected nets, and the mapping is according to these larger ranges.

For instance, in an illustrative example depicted in FIG. 4B, the net of the example of FIG. 4A is a first net 450, selected in combination with a second net 460 which is connected to two sources 461, 462 and four sinks 465, 466, 467, 468. The two sources 461, 462 of the second net 460 have current loading magnitudes of −3 mA and −1 mA, respectively, and the four sinks 465, 466, 467, 468 of the second net 460 have current loading magnitudes of 1 mA each.

In the illustrative example, an absolute linear scale 440 is used, although in various embodiments and configurations, the other scale settings are also applicable to a mapping of multiple nets. The scale includes a source gradation range 441 and a sink gradation range 443; the selection and progression of colors in the gradation ranges are substantially identical to those for absolute linear scale 420, and 0 mA is preferably mapped to both source and sink minimum limits 441*b* and 443*b*. Unlike in FIG. 4A, the maximum of the absolute values of all current loading magnitudes for the circuit nodes of both nets is determined. In this example, of the fourteen magnitudes, the maximum according to absolute value is −3.0 mA, so its absolute value (3.0 mA) is mapped to the sink maximum limit 443*a* and the negative of its absolute value, −3.0 mA, is mapped to the source maximum limit 443*b*. The mapping then increments linearly as an absolute linear scale 420.

The magnitudes of the sources and sinks of each net are therefore mapped to specific colors on the gradation ranges as shown in FIG. 4B. A few features are noted. First, although the magnitude mapped to the maximum source limit (blue) is source 461 of the second net 460, the magnitude mapped to the maximum sink limit (red) is sink 455 of the first net 450. Second, similarly, although the magnitude mapped to the maximum source limit (blue) is source 461 of the second net 460, the magnitude mapped closest to the minimum source limit (cyan) is source 454 of the first net 450. Third, the sinks 465-468 of the second net 460 all have identical current loading magnitudes as sink 456 of the first net 450, and therefore all five map to a substantially identical color (a mid-range orange), while none of sinks 465-468 of the second net 460 map close to either the maximum or minimum sink limits.

Returning to FIG. 2A, at 260, the sources and sinks are each overlaid with visual indicia in the graphic user interface of a circuit layout editor, based on the mapping of the gradation ranges. This operation was previously depicted and explained in relation in FIG. 1B for individual circuit nodes, and FIG. 1C for clusters, according to an embodiment of the invention. In certain embodiments, if a circuit node or cluster is not visible within a display canvas of the graphic user interface, visual indicia are not overlaid upon that node or cluster. In certain embodiments, the electronic component or components associated with a circuit node or cluster are highlighted, rather than the node or cluster itself.

At 270, optionally, the sources and sinks are also each labeled with a text-based or other additional graphic annotation representing the current loading magnitude. In one embodiment, the annotation content is a simple text statement of the current loading magnitude, but in alternate embodiments and configurations, other information such as the name of the associated component is included, or the information is expressed in some suitable manner other than text.

Figure 2D:
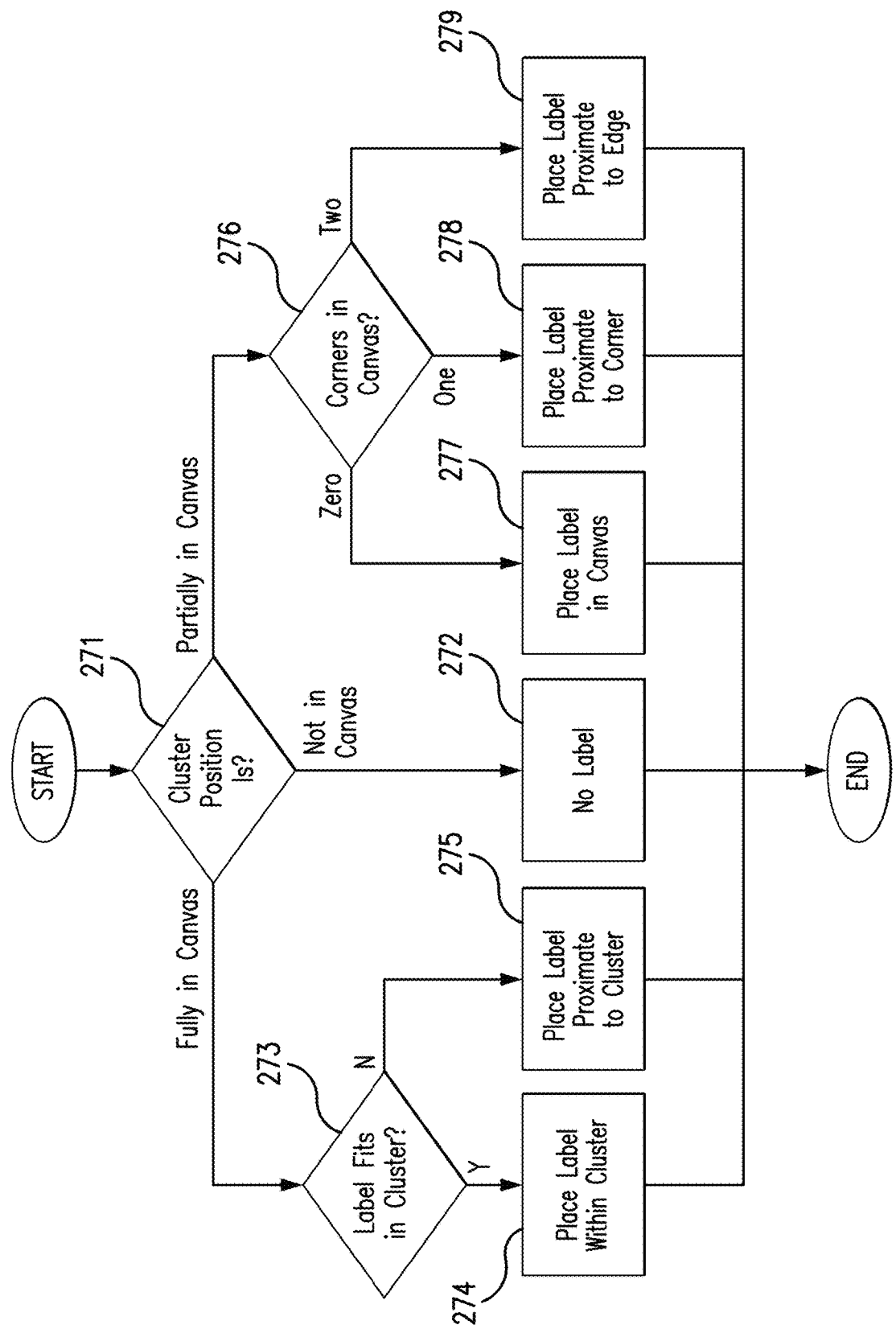
FIG. 2D is a flow diagram illustrating a flow of processes for graphically annotating a current loading magnitude for a cluster, in accordance with an exemplary embodiment of the invention.

In certain embodiments, this labeling is performed in accordance with a method, depicted in FIG. 2D, of graphically annotating a current loading magnitude for a cluster. For brevity, it is assumed that clusters have been selected at 230, but the principles of the depicted method are similarly applicable to individual nodes.

Figure 5:
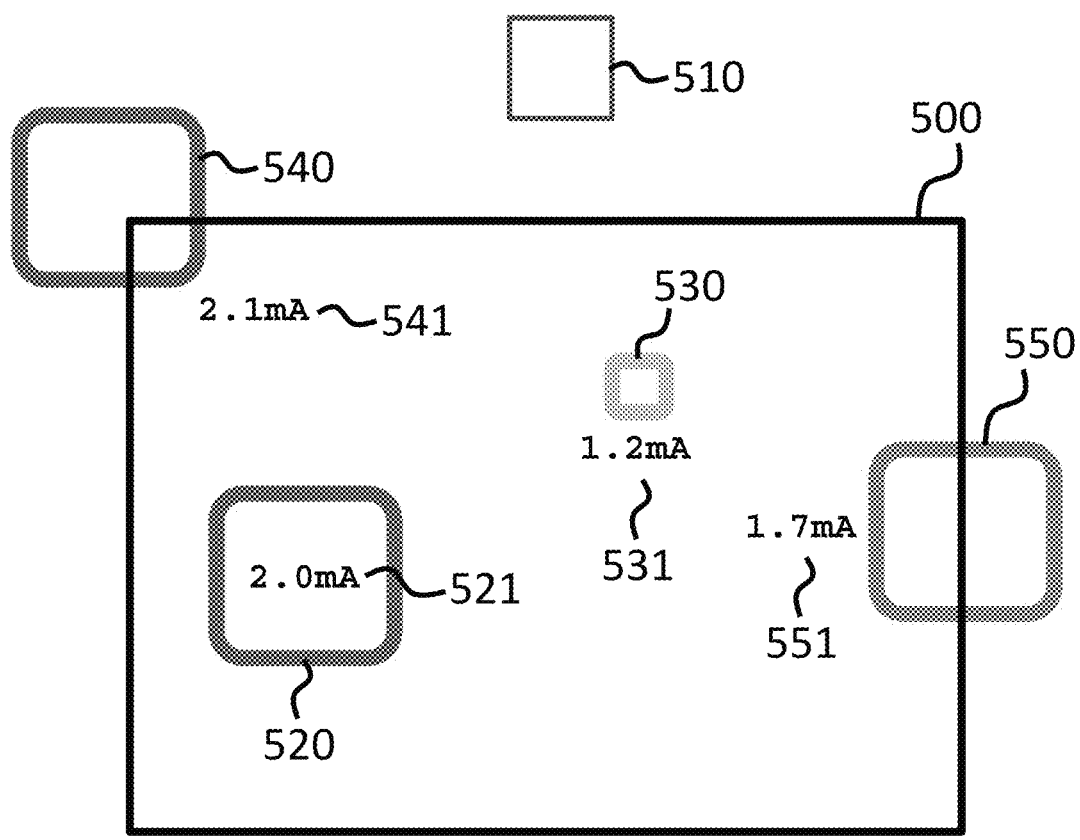
FIG. 5 is a depiction of an illustrative example of an arrangement of electrical components rendered on a display canvas and annotated by the annotation method of FIG. 2D, in accordance with an exemplary embodiment of the invention.

Additionally, FIG. 5 depicts an illustrative example of an arrangement of clusters, relative to a display canvas. It is noted that the region outside the display canvas would be invisible to a user viewing the display in an implemented system.

According to the method of FIG. 2D, at 271, the position of the cluster relative to the edges of a display canvas is determined. In an alternative embodiment, the position of a bounding box of the cluster, established in a manner comparable to operation 222 of FIG. 2B, is checked instead of the cluster itself.

If no portion of the cluster is within the display canvas, the method proceeds to 272, and no annotation is applied. In the illustrative example of FIG. 5, cluster 510 is completely outside a display canvas 500, and therefore no annotation is placed for cluster 510. (It is noted that, in this embodiment, no highlighting or other visual indicia has been applied to cluster 510 either.) The method then ends.

If the entire cluster is fully within the display canvas, the method proceeds to 273, and it is determined whether the annotation label can fit within the cluster. The size of the annotation label is in various embodiments dependent on annotation content settings. If the annotation label can fit within the cluster, as is the case for cluster 520 in the illustrative example of FIG. 5, an annotation such as 521 is applied within the cluster at 274, such as at the center of the cluster or proximate to the inner edge of the cluster. If the annotation label cannot fit within the cluster, as is the case for cluster 530 in the illustrative example of FIG. 5, an annotation such as 531 is applied outside and proximate to the cluster at 274, such as immediately above or beneath the cluster. In either case, the method then ends.

If only a portion of the cluster is within the display canvas, the method proceeds to 276, and it is determined how many corners of the cluster are within the display canvas. If no corners of the cluster are within the display canvas, but the cluster itself is partially within the display canvas (as previously determined at 271), then the cluster is larger than the display canvas and fills it completely. The annotation label is therefore applied generally in the display area at 277, such as in the center or proximate to the inner edge of the display canvas. If exactly one corner of the cluster is within the display canvas, as is the case for cluster 540 of the illustrative example of FIG. 5, an annotation such as 541 is applied proximate to the visible corner of the cluster at 277, preferably outside the cluster. If two corners of the cluster are within the display canvas, as is the case for cluster 550 of the illustrative example of FIG. 5, an annotation such as 551 is applied proximate to the edge between these corners at 277, preferably outside the cluster and aligned to the center of the edge. In any of these cases, the method then ends.

It is noted that the described method is preferably repeated for all clusters of the selected net or nets.

Once the annotation 270 is completed for all clusters of the selected net or nets, the method of FIG. 2A ends.

Figure 6:
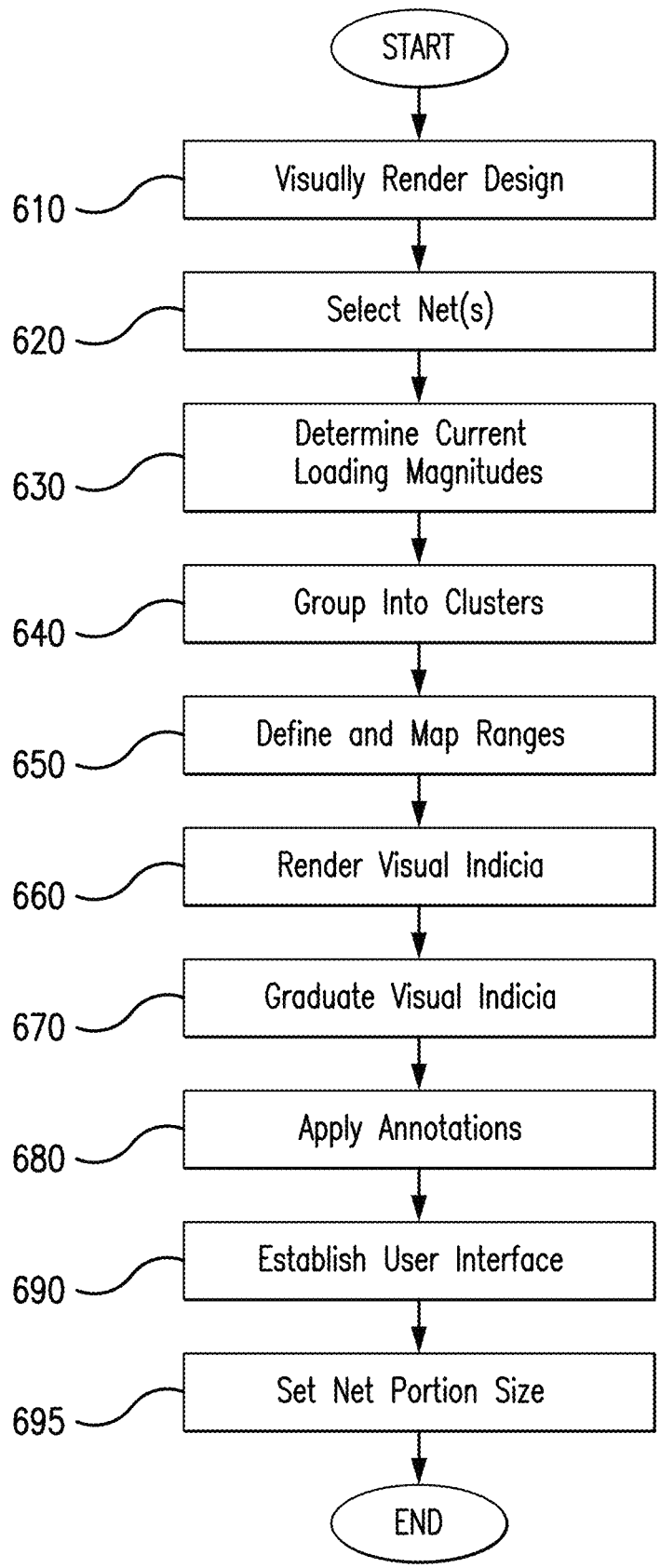
FIG. 6 is a flow diagram illustrating a flow of processes for interactively editing an electronic circuit design with preemptive indication of current loading for one or more nets, in accordance with an exemplary embodiment of the present invention.

FIG. 6 depicts a method of interactively editing an electronic circuit design with preemptive indication of current loading for one or more nets, according to an exemplary embodiment of the current invention.

At 610, an electronic circuit design, or a part thereof, is visually rendered on a display as a graphic representation of a circuit layout, such as shown in FIG. 1A. Several suitable processes of rendering layouts are well-known in the art and will not be elaborated on here.

At 620, one or more nets are selected. This selection was previously described in relation to operation 210 of FIG. 2A.

At 630, current loading magnitudes at one or more of the circuit nodes interconnected by the selected net or nets are determined. This determination was previously described in relation to operation 220 of FIG. 2A.

At 640, optionally, the circuit nodes of the selected net are selectively grouped into a cluster based on predetermined clustering criteria, in various embodiments including at least one of relative proximities of the circuit nodes, relative directional orientations of the circuit nodes, and type of electronic component associated with each circuit node. The current loading magnitude of the cluster is then collectively defined by its circuit nodes. Suitable processes for this clustering were previously described in relation to operation 240 of FIG. 2A.

At 650, a gradation range, or preferably two such ranges for sources and sinks respectively, are defined. The gradation range is for visual indicia of preselected type. A range of current loading magnitudes, either of the circuit nodes or of the clusters, is also mapped to the gradation range. Suitable processes for this definition and mapping were previously described in relation to operation 250 of FIG. 2A.

At 660, visual indicia are rendered for at least one of the circuit nodes of the selected nets, concurrently with and superimposed upon the displayed part of the circuit design, and at 670, those visual indicia are graduated responsive to the current loading magnitude determined for the circuit node. For example, if the visual indicia is a colored highlighting, as in FIG. 1B or 1C, a highlighting is rendered to surround the circuit node (or its component or cluster) at 660, and then, responsive to the applicable current loading magnitude, a mapped coloration from the gradation range is applied to the highlighting at 670. Suitable processes for this rendering and graduation were previously described in relation to operation 260 of FIG. 2A.

At 680, optionally, a graphic annotation indicating the magnitude of current loading for at least one circuit node of the selected net is adaptively displayed with the displayed part of the electronic circuit design. Suitable processes for displaying this annotation were previously described in relation to operation 270 of FIG. 2A.

At 690, a user interface is established for the display, and at 695, the user interface is actuated to set or adjust the size at least one segment or portion of the selected net within the physical layout. Various suitable user interfaces are well-known in the art and will not be elaborated on here. Responsive to the reference provided by the visual indicia, a user may more intuitively set the size of segments of the net in proportion to the current loading magnitudes.

Figure 7:
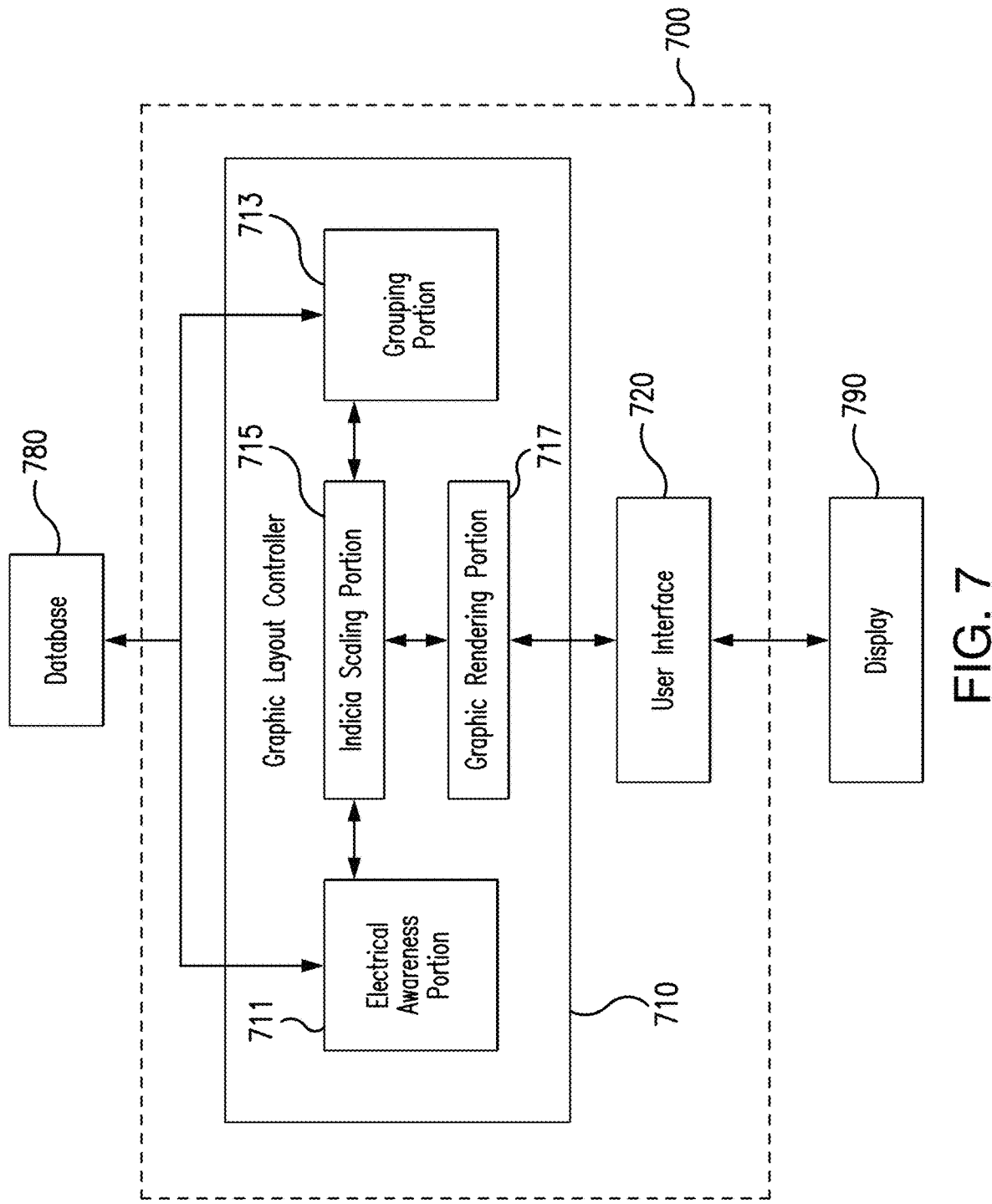
FIG. 7 is a block diagram illustrating a system for interactively editing an electronic circuit design with preemptive indication of current loading for one or more nets, in accordance with an exemplary embodiment of the present invention.

FIG. 7 depicts a system for interactively editing an electronic circuit design with preemptive indication of current loading for one or more nets, according to an exemplary embodiment of the current invention.

A circuit editor 700 executes on a processor, and includes a graphic layout controller 710 and a user interface 720. The graphic layout controller 710 retrieves and provides data structures representing an electronic circuit design and circuit elements thereof on a database 780 to which it is coupled. The graphic layout controller 710 also processes these structures in according to various methods including those described above. The graphic layout controller 710 is also coupled to the user interface 720, which takes user input to direct the processing of the graphic layout controller 710, and provides instructions to a coupled display 790.

The database 780 stores data structures representing electronic circuit designs and circuit elements thereof. In one embodiment, the database 780 implemented according to the OpenAccess standard, but various other suitable implementations will be conceivable by those of skill in the art.

The display 790 visually renders the electronic circuit design, or a part thereof, to graphically represent a physical layout thereof, in accordance with the instructions of the user interface 720. It is noted that the term "display" as used herein refers generally to suitable devices known in the art to be capable of visual presentation, including but not limited to a computer monitor, laptop screen, tablet screen, handheld screen, panel screen, smart phone, smart watch, television, projector, electronic paper, head-mounted display, holographic display or other three-dimensional projector, or virtual reality/augmented reality system.

The graphic layout controller 710 includes an electrical awareness portion 711, which determines a magnitude of current loading at one or more of the circuit nodes interconnected by a selected one of the nets of the circuit design. This magnitude is in certain embodiments determined in accordance with operation 220 of FIG. 2A. The electrical awareness portion 711 can also, in various embodiments, monitor other aspects of the circuit design as stored in the database 780 and track changes and their effects on the design operation. Yet other methods suitable for execution by electrical awareness portion 711 may be conceived by those of skill in the art.

The graphic layout controller 710 includes a grouping portion 713, which selectively groups a plurality of circuit nodes of the selected net into a cluster having a magnitude of currently loading defined collectively by the circuit nodes thereof. The grouping is based on predetermined clustering criteria, and is in certain embodiments performed in accordance with operation 240 of FIG. 2A. The grouping portion 713 can also, in various embodiments, define other groups of circuit elements, such as determining which elements are interconnected into a single defined net. Yet other methods suitable for execution by grouping portion 713 may be conceived by those of skill in the art.

The graphic layout controller 710 includes an indicia scaling portion 715, which defines a gradation range for visual indicia of preselected type and maps a range of magnitudes for current loading at one or more circuit nodes of the selected net thereto, as determined by the electrical awareness portion 711. If the grouping portion 713 has grouped the nodes into clusters, the magnitudes may be for the clusters instead of the individual circuit nodes. This definition and mapping is in certain embodiments performed in accordance with operation 250 of FIG. 2A. Yet other methods suitable for execution by indicia scaling portion 715 may be conceived by those of skill in the art.

The graphic layout controller 710 includes a graphic rendering portion 717, which adaptively displays the visual indicia for at least one circuit node of the selected net, or for at least one cluster of nodes, through the user interface 720 and display 790. These visual indicia are displayed along with a displayed part of the electronic circuit design. The visual indicia are graduated for said circuit node responsive to the magnitude of current loading determined therefor, based on the determinations of the indicia scaling portion 715 and electrical awareness portion 711. This display and graduation is in certain embodiments performed in accordance with operation 260 of FIG. 2A. The graphic rendering portion 717 also, in certain embodiments, adaptively displays annotations indicating the magnitudes of current loading for the circuit nodes or clusters; in more specific embodiments, these annotations are displayed in accordance with operation 270 of FIG. 2A. The graphic rendering portion 717 can also, in various embodiments, display other elements of the electronic circuit design and/or other visual indicia assisting a designer in identifying features and characteristics of the design. Yet other methods suitable for execution by graphic rendering portion 717 may be conceived by those of skill in the art.

In various embodiments, the graphic layout controller 710 or the circuit editor 700 itself also includes other portions. Such portions in various embodiments include but are not limited to: an automatic routing portion determining ideal routing of interconnections between components, an element extraction portion identifying the schematic equivalents of circuit elements in a layout design, a database reader directly managing the contents of the database and tracking all changes thereto, a circuit editing portion editing the data structures and their parameters in the database to thereby amend the circuit design, a violation checking portion determining whether the design is in compliance with various predetermined design rules, a model assembling portion constructing a model of the present circuit design for simulation, and a simulation portion simulating circuit activity in accordance with the present circuit design. Suitable implementations of each of these portions will be conceivable by those of skill in the art, and therefore these portions are not described in detail or depicted in FIG. 7.

It is noted that those of skill in the art will also understand, based on the principles described herein, how to modify known circuit layout editors to provide the functionality and execute the methods described.

These and related processes, and other necessary instructions, are preferably encoded as executable instructions on one or more non-transitory computer readable media, such as hard disc drives or optical discs, and executed using one or more computer processors, in concert with an operating system or other suitable measures.

In a software implementation, the software includes a plurality of computer executable instructions, to be implemented on a computer system. Prior to loading in a computer system, the software preferably resides as encoded information on a suitable non-transitory computer-readable tangible medium, such as a magnetic floppy disk, a magnetic tape, CD-ROM, or DVD-ROM.

In certain implementations, the invention includes a dedicated processor or processing portions of a system on chip (SOC), portions of a field programmable gate array (FPGA), or other such suitable measures, executing processor instructions for performing the functions described herein or emulating certain structures defined herein. Suitable circuits using, for example, discrete logic gates such as in an Application Specific Integrated Circuit (ASIC), Programmable Logic Array (PLA), or Field Programmable Gate Arrays (FPGA) are in certain embodiments also developed to perform these functions.

Figure 8:
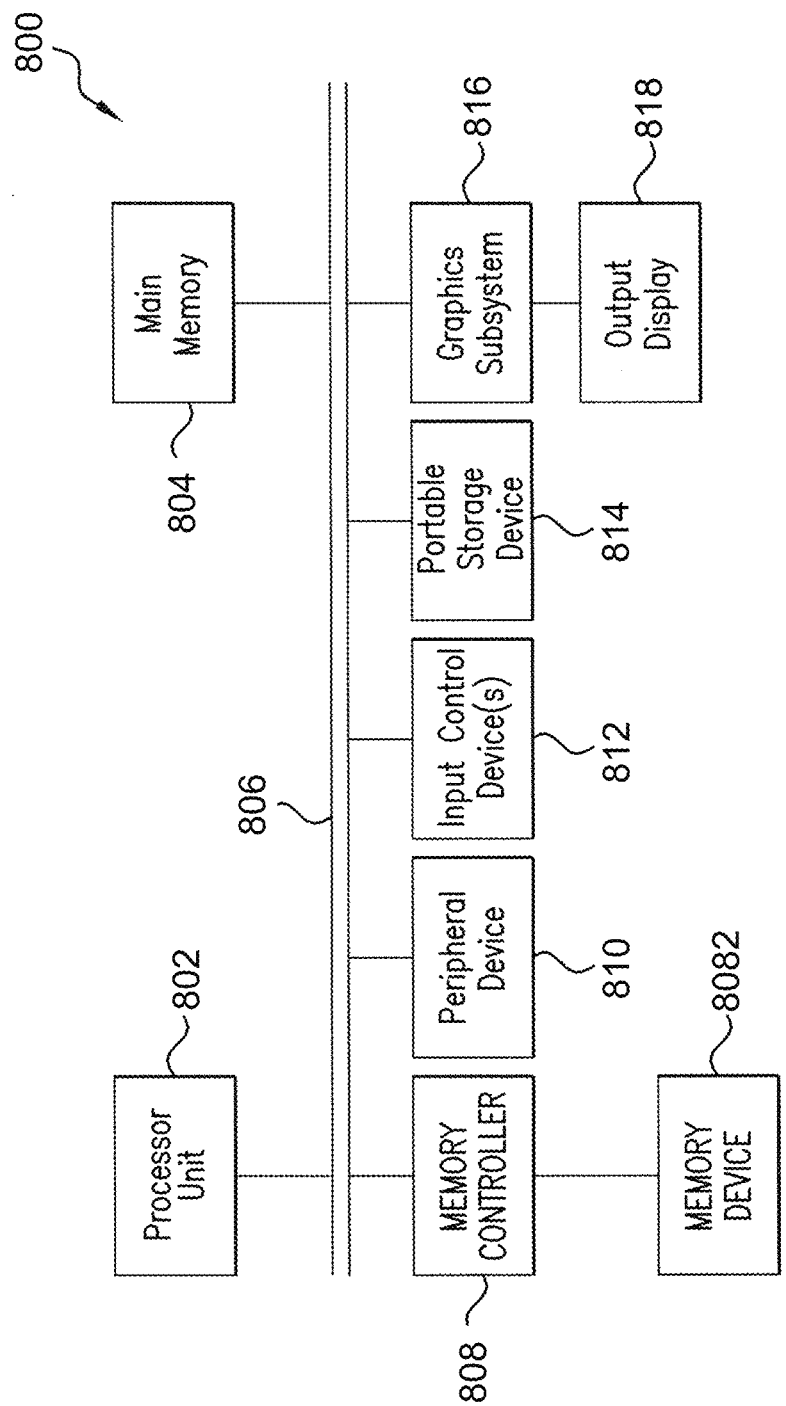
FIG. 8 is a block diagram illustrating an exemplary computer system for programmatic and/or hardware implementation of various embodiments and aspects of the present invention.

As an example, FIG. 8 is a block diagram illustrating an exemplary computer system for programmatic and/or hardware implementation of various aspects of the disclosed system and method. For instance, in various embodiments it serves as a host for such hardware modules, and/or as a host for executing software modules such as electronic design automation (EDA) tools/simulations/emulation/firmware, in accordance with various configurations of the disclosed system and method.

According to certain embodiments, computer system 800 includes a processor unit 802, a main memory 804, an interconnect bus 806, a memory controller 808 that is coupled to a memory device 8082, peripheral device(s) 810, input control device(s) 812, portable storage medium drive (s) 814, a graphics subsystem 816, and an output display 818. In various embodiments, processor unit 802 includes a single microprocessor or a plurality of microprocessors for configuring computer system 800 as a multi-processor system. Main memory 804 stores, in part, instructions and data to be executed by processor unit 802. Main memory 804 preferably includes banks of dynamic random access memory (DRAM) as well as high-speed cache memory.

For the purpose of simplicity, the components of computer system 800 are depicted to be interconnected via interconnect bus 806. However, in alternate embodiments, computer system 800 is interconnected through one or more data transport means. For example, in certain embodiments, processor unit 802 and main memory 804 are interconnected via a local microprocessor bus; and memory controller 808, peripheral device(s) 810, portable storage medium drive(s) 814, and graphics subsystem 816 are interconnected via one or more input/output (I/O) buses. Memory device 8082 is preferably implemented as a nonvolatile semiconductor memory for storing data and instructions to be used by processor unit 802. Memory device 8082 preferably stores the software to load it to the main memory 804, but in alternate embodiments is represented in an EDA tool simulation by suitable classes (incorporating data structures and functions operable upon the data structures) or the like as would be known to one of skill in the art.

Portable storage medium drive 814 operates to input and output data and code to and from the computer system 800. In one configuration, the software is stored on such a portable medium, and is input to computer system 800 via portable storage medium drive 814. In various embodiments, peripheral device(s) 810 includes any type of computer support device such as an input/output (I/O) interface, to add additional functionality to computer system 800. For example, in certain embodiments, peripheral device(s) 810 includes a network interface card, to interface computer system 800 to a network. In certain embodiments, peripheral device(s) also includes a memory controller and nonvolatile memory.

Input control device(s) 812 provide a portion of the user interface for a computer system 800 user. In various embodiments, input control device(s) 812 includes an alphanumeric keypad for inputting alphanumeric and other key information; and a cursor control device such as a mouse, a trackpad or stylus; or cursor direction keys.

In order to display textual and graphical information, computer system 800 includes graphics subsystem 814 and output display(s) 818. In various embodiments, output display 818 includes a cathode ray tube (CRT) display, liquid crystal display (LCD), plasma, or active matrix organic light emitting diode (AMOLED) display. Graphics subsystem 816 receives textual and graphical information, and processes the information for output to display 818.

The descriptions above are intended to illustrate possible implementations of the disclosed system and method, and are not restrictive. While this disclosure has been made in connection with specific forms and embodiments thereof, it will be appreciated that various modifications other than those discussed above may be resorted to without departing from the spirit or scope of the disclosed system and method. Such variations, modifications, and alternatives will become apparent to the skilled artisan upon a review of the disclosure. For example, functionally equivalent elements or method steps are substitutable for those specifically shown and described, and certain features are usable independently of other features. Additionally, in various embodiments, all or some of the above embodiments are selectively combined with each other, and particular locations of elements or sequence of method steps are reversed or interposed, all without departing from the spirit or scope of the disclosed system and method as defined in the appended claims. The scope should therefore be determined with reference to the description above and the appended claims, along with their full range of equivalents.

What is claimed is:

1. A system for interactively editing an electronic circuit design defined by a plurality of electronic components interconnected at respective circuit nodes by a plurality of nets, having preemptive indication of current loading for one or more of the nets, the system comprising:
   a display visually rendering at least a part of the electronic circuit design to graphically represent a physical layout thereof;
   a graphic layout controller executed on a processor coupled to said display, said graphic layout controller including:
      an electrical awareness portion determining a magnitude of current loading at one or more of the circuit nodes interconnected by a selected one of the nets;
      an indicia scaling portion defining a gradation range for visual indicia of preselected type and mapping a range of magnitudes for the current loading of the one or more circuit nodes of the selected net thereto; and,
      a graphic rendering portion adaptively displaying with the displayed part of the electronic circuit design the visual indicia for at least one circuit node of the selected net, the visual indicia for said circuit node being graduated within the gradation range responsive to the magnitude of current loading determined therefor, the adaptively displayed visual indicia providing a reference for proportionately sizing one or more segments of the selected net within the physical layout; and,
   a user interface coupled to said display and graphic layout controller.

2. The system as recited in claim 1, wherein said graphic layout controller includes a grouping portion selectively grouping a plurality of circuit nodes of the selected net into a cluster having a magnitude of current loading defined collectively by the circuit nodes thereof, the circuit nodes of the cluster being grouped based on predetermined clustering criteria.

3. The system as recited in claim 2, wherein said predetermined clustering criteria are defined according to at least one factor selected from the group consisting of: relative proximities of the circuit nodes, relative directional orientations of the circuit nodes, and type of electronic component associated with each of the circuit nodes.

4. The system as recited in claim 2, wherein said graphic rendering portion adaptively displays the visual indicia for at least one cluster of circuit nodes.

5. The system as recited in claim 1, wherein the preselected type of visual indicia includes color, said indicia scaling portion defining the gradation range within a predetermined color spectrum.

6. The system as recited in claim 1, wherein said indicia scaling portion defines alternative gradation ranges for circuit nodes depending on operation thereof as a current source or as a current sink.

7. The system as recited in claim 6, wherein said indicia scaling portion defines the alternative gradation ranges according to at least one scale type selected from the group consisting of:
- a relative linear scale type wherein the alternative gradation ranges map to different ranges of current loading magnitude, and each range of current loading magnitude is linearly incremented between minimum and maximum magnitudes;
- an absolute linear scale type wherein the alternative gradation ranges map to equivalent ranges of current loading magnitude, and each range of current loading magnitude is linearly incremented between minimum and maximum magnitudes;
- a relative distributed scale type wherein the alternative gradation ranges map to different ranges of current loading magnitude, and each range of current loading magnitude is nonlinearly incremented between the minimum and maximum magnitudes; and,
- an absolute distributed scale type wherein the alternative gradation ranges map to equivalent ranges of current loading magnitude, and each range of current loading magnitude is nonlinearly incremented between the minimum and maximum magnitudes.

8. The system as recited in claim 1, wherein said graphic rendering portion adaptively displays with the displayed part of the electronic circuit design a graphic annotation indicating the magnitude of current loading determined for at least one circuit node of the selected net.

9. The system as recited in claim 1, wherein the magnitude of current loading determined for the one or more circuit nodes of the selected net defines a maximum value occurring thereat during simulated operation of the electronic circuit design.

10. A system for interactively editing an electronic circuit design defined by a plurality of electronic components interconnected at respective circuit nodes by a plurality of nets, having preemptive indication of relative current loading for one or more of the nets, the system comprising:
- a display visually rendering at least a part of the electronic circuit design to graphically represent a physical layout thereof;
- a graphic layout controller executed on a processor coupled to said display, said graphic layout controller including:
  - an electrical awareness portion determining a magnitude of current loading at each of the circuit nodes interconnected by a selected one of the nets;
  - an indicia scaling portion defining a gradation range for visual indicia of preselected type and mapping a range of magnitudes for the current loading of one or more circuit nodes of the selected net thereto, said indicia scaling portion defining alternative gradation ranges for circuit nodes depending on operation thereof as a current source or as a current sink; and,
  - a graphic rendering portion adaptively displaying the visual indicia for at least one circuit node of the selected net superimposed on the displayed part of the electronic circuit design, the visual indicia for each said circuit node being graduated within the gradation range responsive to the magnitude of current loading determined therefor, the adaptively displayed visual indicia providing a reference for proportionately sizing a segment of the selected net terminating at the circuit node relative to another segment of the selected net within the physical layout; and,
- a user interface coupled to said display and graphic layout controller.

11. The system as recited in claim 10, wherein the preselected type of visual indicia includes color, said indicia scaling portion defining the gradation range within a predetermined color spectrum, the alternative gradation ranges for current sourcing and current sinking circuit nodes being defined within different segments of the predetermined color spectrum.

12. The system as recited in claim 11, wherein:
- said graphic layout controller includes a grouping portion selectively grouping a plurality of circuit nodes of the selected net into a cluster having a magnitude of current loading defined collectively by the circuit nodes thereof, the circuit nodes of the cluster being grouped based on predetermined clustering criteria; and,
- said graphic rendering portion adaptively displays the visual indicia for at least one cluster of circuit nodes.

13. The system as recited in claim 10, wherein said indicia scaling portion defines the alternative gradation ranges according to at least one scale type selected from the group consisting of:
- a relative linear scale type wherein the alternative gradation ranges map to different ranges of current loading magnitude, and each range of current loading magnitude is linearly incremented between minimum and maximum magnitudes;
- an absolute linear scale type wherein the alternative gradation ranges map to equivalent ranges of current loading magnitude, and each range of current loading magnitude is linearly incremented between minimum and maximum magnitudes;
- a relative distributed scale type wherein the alternative gradation ranges map to different ranges of current loading magnitude, and each range of current loading magnitude is nonlinearly incremented between the minimum and maximum magnitudes; and,
- an absolute distributed scale type wherein the alternative gradation ranges map to equivalent ranges of current loading magnitude, and each range of current loading magnitude is nonlinearly incremented between the minimum and maximum magnitudes.

14. The system as recited in claim 11, wherein said graphic rendering portion adaptively displays with the displayed part of the electronic circuit design a graphic annotation indicating the magnitude of current loading determined for at least one circuit node of the selected net.

15. The system as recited in claim 10, wherein the magnitude of current loading determined for the one or more circuit nodes of the selected net defines maximum value occurring thereat during simulated operation of the electronic circuit design.

16. A method for interactively editing an electronic circuit design defined by a plurality of electronic components interconnected at respective circuit nodes by a plurality of nets, with preemptive indication of current loading for one or more of the nets, the method comprising:
- visually rendering on a display at least a part of the electronic circuit design to graphically represent a physical layout thereof;
- actuating a computer processor to execute a graphic layout controller implemented thereon, execution of said graphic layout controller including:

determining a magnitude of current loading at one or more of the circuit nodes interconnected by a selected one of the nets;

defining a gradation range for visual indicia of preselected type and mapping a range of magnitudes for the current loading of the one or more circuit nodes of the selected net thereto;

adaptively rendering the visual indicia for at least one circuit node of the selected net concurrently with the displayed part of the electronic circuit design; and, graduating the visual indicia for said circuit node within the gradation range responsive to the magnitude of current loading determined therefor;

establishing a user interface to said display and graphic layout controller; and, actuating said user interface to proportionately adjust at least one segment of the selected net in size relative to another segment of the selected net within the physical layout based on the adaptively rendered visual indicia.

17. The method as recited in claim 16, wherein execution of said graphic layout controller includes:

selectively grouping a plurality of circuit nodes of the selected net into a cluster based on predetermined clustering criteria, the cluster having a magnitude of current loading defined collectively by the circuit nodes thereof; and, adaptively displaying the visual indicia for at least one cluster of circuit nodes the circuit nodes of the cluster being grouped.

18. The method as recited in claim 16, wherein:

the preselected type of visual indicia includes color; and, execution of said graphic layout controller includes defining a plurality of gradation ranges each within a predetermined color spectrum, different gradation ranges being defined within different segments of the predetermined color spectrum for circuit nodes depending on operation thereof as a current source or as a current sink.

19. The method as recited in claim 18, wherein the gradation ranges are defined according to at least one scale type selected from the group consisting of:

a relative linear scale type wherein the gradation ranges map to different ranges of current loading magnitude, and each range of current loading magnitude is linearly incremented between minimum and maximum magnitudes;

an absolute linear scale type wherein the gradation ranges map to equivalent ranges of current loading magnitude, and each range of current loading magnitude is linearly incremented between minimum and maximum magnitudes;

a relative distributed scale type wherein the gradation ranges map to different ranges of current loading magnitude, and each range of current loading magnitude is nonlinearly incremented between the minimum and maximum magnitudes; and, an absolute distributed scale type wherein the gradation ranges map to equivalent ranges of current loading magnitude, and each range of current loading magnitude is nonlinearly incremented between the minimum and maximum magnitudes.

20. The method as recited in claim 16, wherein:

execution of said graphic layout controller includes adaptively displaying with the displayed part of the electronic circuit design a graphic annotation indicating the magnitude of current loading determined for at least one circuit node of the selected net; and, the magnitude of current loading determined for the one or more circuit nodes of the selected net defines a maximum value occurring thereat during simulated operation of the electronic circuit design.

* * * * *